*(12)* United States Patent
Takei et al.

(10) Patent No.: US 7,151,239 B2
(45) Date of Patent: Dec. 19, 2006

(54) HEAT TREATING APPARATUS AND HEAT TREATING METHOD

(75) Inventors: Toshichika Takei, Koshi-Machi (JP); Masatoshi Kaneda, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 24 days.

(21) Appl. No.: 11/134,451

(22) Filed: May 23, 2005

(65) Prior Publication Data

US 2005/0258165 A1 Nov. 24, 2005

(30) Foreign Application Priority Data

May 24, 2004 (JP) ............................. 2004-153606

(51) Int. Cl.
*H05B 3/68* (2006.01)
*H05B 1/02* (2006.01)

(52) U.S. Cl. ................................. 219/444.1; 219/482

(58) Field of Classification Search .............................
219/443.1–443.12, 292–484; 229/724–729
See application file for complete search history.

(56) References Cited

U.S. PATENT DOCUMENTS

| | | | |
|---|---|---|---|
| 6,222,161 B1 * | 4/2001 | Shirakawa et al. | 219/390 |
| 6,461,438 B1 * | 10/2002 | Ookura et al. | 118/724 |
| 6,469,283 B1 * | 10/2002 | Burkhart et al. | 219/486 |
| 6,644,965 B1 * | 11/2003 | Ookura et al. | 432/253 |
| 7,049,553 B1 * | 5/2006 | Shigetomi et al. | 219/482 |

FOREIGN PATENT DOCUMENTS

JP 11-74187 3/1999

OTHER PUBLICATIONS

Computer-generated translation of JP11-74187.

* cited by examiner

*Primary Examiner*—Sang Paik
(74) *Attorney, Agent, or Firm*—Smith, Gambrell & Russell, LLP

(57) ABSTRACT

A heat treating apparatus is provided to apply a heat treatment on a substrate. Prior to the heat treatment, an exclusive transfer mechanism transfers the substrate from a cooling plate onto a heating plate for heating the substrate. Before mounting the substrate on the heating plate, the control mode for heater modules for heating the heating plate on power supply module is switched from a PID control by a regulating part in a controller of the apparatus to a MV control by a fixed-pattern output part in the controller. Next, at a predetermined timing since the substrate has been mounted on the heating plate, the MV control is switched to the PID control. Consequently, it becomes possible to quickly restore a reduce temperature of the heating plate prior to the mounting of substrate on the heating plate and also possible to quickly stabilize a so-raised temperature of the heating plate, accomplishing a heating process with high accuracy and shirt time. Accordingly, when it is required to perform a designated heat treatment on condition that a substrate is mounted on the heating plate whose temperature is stabilized to a processing temperature as a target, the heat treatment with high accuracy can be accomplished in a short time.

25 Claims, 10 Drawing Sheets

HEAT TREATING APPARATUS AND HEAT TREATING METHOD

BACKGROUND OF THE INVENTION

1. Field of the Invention

This invention relates to heat treating apparatus and method for heating a substrate, such as mask substrate for photomask, after applying resist liquid on the substrate or after exposing the resist liquid on the substrate and before developing the substrate.

2. Background Art

In the manufacturing process for semiconductor devices, a manufacturing technology called "photo lithography" is employed to form a desired resist pattern on the surface of a semiconductor. Also, for a rectangular mask substrate (reticle substrate) as an exposure mask for a semiconductor device, the lithography is used as well, where resist liquid is firstly applied on the surface of the substrate and secondly, the resulting resist film is exposed using a desired pattern and thereafter, the mask substrate is developed to form a designated resist pattern on the surface of the substrate.

It is noted that the above-mentioned resist liquid is obtained by dissolving components of a coating film in solvent. Therefore, after applying the resist liquid on the substrate, a heat treatment called "baking" where the substrate is heated to a predetermined temperature is performed to volatilize the solvent from the substrate. After the heat treatment, the substrate is cooled down to a designated temperature prior to the exposure. For example, this heat treatment or cool-down treatment is carried out on condition of mounting the substrate on the surface of a mount table equipped with heating unit or cooling unit.

Now, one example of a heating device for heating a substrate is described with reference to FIG. 10, in brief. In the figure, reference numeral 1 denotes a heating plate on which a substrate G is mounted. On the surface of the heating plate 1, a plurality of projections 11 (for example, four projections) are formed to support the back side of the substrate G in a slightly-floated state from the surface of the heating plate 1 through a gap (e.g. interval of approx. 0.5 mm), avoiding an adhesion of particles to the back side of the substrate G. The heating plate 1 is provided, therein, with a heater 12 as the heating unit. Based on a detecting value from a sensing element 13 (e.g. thermocouple), a controller 14 controls an output (i.e. heating operation) of the heater 12 under PID (Proportional Integral Differential) control, so that the substrate G above the plate 1 is heated up to a designated temperature (e.g. 130° C.). Note, reference numeral 15 denotes a lid body for the heating plate 1, which can move up and down. Reference numeral 16 denotes elevating pins for delivering the substrate G onto the heating plate 1.

In the heating device like this, the lid body 15 is elevated to open the device and then, the elevating pins 16 are spaced from the heating plate 1 to receive the substrate G from not-shown transfer mean. On receipt of the substrate G, subsequently, the elevating pins 16 are lowered to mount the substrate G on the heating plate 1. Then, the lid body 15 is also lowered to close up the device. On the formation of a closed processing space above the heating plate 1, a designated heat treatment is applied on the substrate G.

When intending to heat the substrate G, there exists a remarkable temperature difference between the substrate G and the heating plate 1 since the temperature of the substrate G is relatively low, for example, approx. 23° C. Accordingly, when the substrate G is mounted on the heating plate 1, the surface temperature of the heating plate 1 is lowered rapidly due to absorption of heat by the substrate G. If the responsibility of the PID control is established high (i.e. establishment of high setting values for P, I and D) for purpose of recovering the temperature of the heating plate 1 for a designated temperature as possible, then the output of the heater 12 becomes larger, so that the temperature of the heating plate 1 exceeds a target value in overshoot. As a result, with the overshoot of the heating plate 1 in temperature, the temperature of the substrate G may overshoot disadvantageously, as well.

In such a case, there is a possibility of producing great deviations in the thickness of coating films formed on the substrates G. In order to deal with such a disadvantage, if the responsibility of the PID control is established low so as to elevate the temperature of the heating plate 1 moderately in view of avoiding its overshoot in temperature, a long time will be required to recover the temperature of the plate 1 for the target value, also causing a disadvantage. Under the present circumstances, the controller 14 is provided with one control loop for the PID control and another control loop for executing a fixed control (i.e. MV control) to supply the heater 12 with power in accordance with a fixed output pattern while utilizing a timer and a method utilizing the structure. In the method, when the substrate G is mounted on the heating plate 1 as a result of lowering the elevating pins 16, the PID control is switched to the MV control to increase a heat-up rate of the heating plate 1. Then, with the elapse of a predetermined period, the MV control is changed to the PID control (see paragraph No. 0028 to 0030 and FIG. 4 in Japanese Patent Publication No. 11-74187).

However, the technique disclosed in Japanese Patent Publication No. 11-74187 has the following problem. As mentioned above, in order to heat the substrate G, it is necessary to open the lid body 15 of the heating device prior to the operation of not-shown transfer unit to mount the substrate G on the heating plate 1. That is, when opening the lid body 15, a heat radiation is caused through the resulting opening of the heating device to lower the temperature of the heating plate 1. Since the heat radiation occurs the peripheral area of the heating plate 1 at first, the temperature about the peripheral area of the plate 1 comes down in comparison with the temperature of a center area of the plate 1.

Thus, the reduction in the temperature of the peripheral area of the heating plate 1 causes the action of PID control to be accelerated by the time of mounting the substrate G on the plate 1, so that the output of the heater 12 gets larger at the peripheral area. As a result, the temperature of the peripheral area of the heating plate 1 becomes too high in comparison with that of the center area of the plate 1. Then, the substrate G is mounted on the heating plate 1 where its in-plane temperature distribution changes for the worse. Since the MV control does not allow the temperature difference between the peripheral area of the plate 1 and the center area to be redressed, the in-plane temperature distribution of the substrate G in its heat-up period deteriorates consequently.

Thus, it is difficult to accomplish uniform heat treatment in the surface of the substrate G, causing the evaporation rate of solvent in the coating liquid on the substrate G to be inhomogeneous in plane. As a result, there is a worry that the film thickness of the coating film varies in the surface of the substrate. Additionally, since it is difficult to apply uniform heat treatment on the substrates G, the film thickness of the coating film may vary among the substrates G. For the mask substrate, since it is required to have in-plane uniformity with high accuracy, such a problem becomes obvious.

However, the above-mentioned publication (No. 11-74187) does not suggest or teach a technique to dissolve such a problem.

SUMMARY OF THE INVENTION

In the above-mentioned situation, it is an object of the present invention to provide heat treating apparatus and method capable of heat treatment with high accuracy in a short time when applying a designated heat treatment on a substrate mounted on a heating plate under condition that the temperature of the substrate is stabilized at a processing temperature as a target temperature. Another object of the invention is to provide heat treating apparatus and method capable of enhancing the in-plane uniformity in the temperature of the heating plate thereby applying a heat treatment with high "in-plane" uniformity on the substrate.

In order to accomplish the above object, according to the first feature, the present invention provides a heat treating apparatus comprising: a heating plate for applying a designate heat treatment to a substrate mounted on a surface of the heating plate, the heating plate being heated by heating unit generating heat on power supply; a cooling plate on which the substrate loaded from its outside is mounted, thereby cooling down the substrate; transfer unit configured to exclusively transfer the substrate between the cooling plate and the heating plate; a temperature sensing part for detecting a temperature of the heating plate; a regulating part for calculating an amount of power supply for the heating unit based on a difference between the temperature detected by the temperature sensing part and a target temperature, the regulating part further outputting a first signal corresponding to the amount of power supply calculated; a fixed-pattern output part for outputting a second signal corresponding to an amount of power supply for the heating unit based on a predetermined output pattern; and switching unit that switches a control output from an output of the regulating part to an output of the fixed-pattern output part in a period from a mounting of the substrate on the cooling plate till a mounting of the substrate on the heating plate and that switches the control output from the output of the fixed-pattern output part to the output of the regulating part at a predetermined timing after the substrate has been mounted on the heating plate, so as to compensate the operation of the regulating part derived from any disturbance in loading the substrate.

The second feature of the invention resides in that the heat treating apparatus further comprising a supporting member that is movable up and down, for receiving the substrate above the heating plate when rising and also mounting the substrate onto the heating plate when falling, wherein the switching unit switches the control output from the output of the regulating part to the output of the fixed-pattern output part in a period from the mounting of the substrate on the cooling plate till a delivery of the substrate to the supporting member.

The third feature of the invention resides in that the heat treating apparatus further comprising a lid body for covering an upside space of the heating plate, wherein the switching unit switches the control output from the output of the regulating part to the output of the fixed-pattern output part in a period from an opening of the lid body till a mounting of the substrate on the supporting member.

The fourth feature of the invention resides in that the heating unit is divided into a first heater part for heating the peripheral area of the heating plate and a second heater part for heating the center area of the heating plate, and the temperature sensing part, the fixed-pattern output part and the regulating part are respectively provided in respective groups, corresponding to the first heater part and the second heater part of the heating unit.

The fifth feature of the invention resides in that the heat treating apparatus further comprising: a memory for memorizing a data where sorts of processes to be applied on the substrate respectively correspond to timings of switching the control output between the output of the regulating part and the output of the fixed-pattern output part and selecting unit for selecting a timing of switching the control output between the output of the regulating part and the output of the fixed-pattern output part from the memory, corresponding to the sort of a process applied on the substrate.

The sixth feature of the invention resides in that the heating plate and the cooling plate are arranged so as to adjoin each other in a horizontal direction in a common processing container.

The seventh feature of the invention resides in that the heating plate and the cooling plate are arranged so as to adjoin each other in a vertical direction in a common processing container.

The eighth feature of the invention resides in that a heat treating apparatus comprising: a heating plate for applying a designate heat treatment to a substrate mounted on a surface of the heating plate, the heating plate being heated by heating unit generating heat on power supply; transfer unit configured to receive the substrate loaded from an outside of the apparatus and exclusively transfer the substrate to the heating plate; a temperature sensing part for detecting a temperature of the heating plate; and a regulating part for calculating an amount of power supply for the heating unit based on a difference between the temperature of the heating plate detected by the temperature sensing part and a target temperature, the regulating part further outputting a first signal corresponding to the amount of power supply calculated; a fixed-pattern output part for outputting a second signal corresponding to an amount of power supply for the heating unit based on a predetermined output pattern; and switching unit that switches a control output from an output of the regulating part to an output of the fixed-pattern output part in a period from a mounting of the substrate on the transfer unit till a mounting of the substrate on the heating plate through a transportation of the transfer unit and that switches the control output from the output of the fixed-pattern output part to the output of the regulating part at a predetermined timing since the substrate has been mounted on the heating plate, thereby compensating the operation of the regulating part derived from any disturbance in loading the substrate into the apparatus.

The ninth feature of the invention resides in that the heat treating apparatus further comprising a cooling plate for applying a designate cooling process to the substrate, wherein the transfer unit is configured to transfer the substrate between the cooling plate and the heating plate exclusively.

The tenth feature of the invention resides in that the transfer unit also serves as a cooling plate for applying a designate cooling process to the substrate.

Here, it is noted that an arrangement where a substrate is floating above the surface of the heating plate through a slight gap (e.g. substrate's floating apart from the surface of the heating plate through a gap within 1 mm in order to avoid adhesion of particles to the substrate surface) is defined as being included in such a condition that "the substrate is mounted on the surface of the heating plate for a designated heat treatment". Note, the predetermined timing of switching the control output from an output by the fixed-pattern output part to an output of the regulating part sequential to the mounting of the substrate on the heating plate is identical to a timing when a temperature of the heating plate is approaching a target temperature since the temperature has once fallen due to the mounting of the substrate, for example, a time when the temperature of the plate has approached a temperature within the range of ±4% to the target temperature.

The eleventh feature of the invention resides in that the heat treating apparatus further comprising a supporting member that is movable up and down, for receiving the substrate above the heating plate when rising and also mounting the substrate onto the heating plate when falling, wherein the switching unit switches the control output from the output of the regulating part to the output of the fixed-pattern output part in a period from a mounting of the substrate on the transfer unit till a delivery of the substrate to the supporting member.

The twelfth feature of the invention resides in that the heat treating apparatus further comprising a lid body for covering an upside space of the heating plate, wherein the switching unit switches the control output from the output of the regulating part to the output of the fixed-pattern output part in a period from an opening of the lid body till a mounting of the substrate on the supporting member. The thirteenth feature of the invention resides in that the heating unit is divided into a first heater part for heating the peripheral area of the heating plate and a second heater part for heating the center area of the heating plate, and the temperature sensing part, the fixed-pattern output part and the regulating part are respectively provided in respective groups, corresponding to the first heater part and the second heater part of the heating unit.

The thirteenth feature of the invention resides in that the heating unit is divided into a first heater part for heating the peripheral area of the heating plate and a second heater part for heating the center area of the heating plate, and the temperature sensing part, the fixed-pattern output part and the regulating part are respectively provided in respective groups, corresponding to the first heater part and the second heater part of the heating unit.

The fourteenth feature of the invention resides in that the output pattern is adapted so as to allow the fixed-pattern output part to output respective signals corresponding to respective amounts of power supply to the first heater part and the second heater part of the heating unit so that a temperature of the peripheral area of the heating plate becomes lower than a temperature of the center are of the heating plate.

The fifteenth feature of the invention resides in that the heat treating apparatus further comprising: a memory for memorizing a data where sorts of processes to be applied on the substrate respectively correspond to timings of switching the control output between the output of the regulating part and the output of the fixed-pattern output part and selecting unit for selecting a timing of switching the control output between the output of the regulating part and the output of the fixed-pattern output part from the memory, corresponding to the sort of a process applied on the substrate.

The sixteenth feature of the invention resides in that the heating plate and the cooling plate are arranged so as to adjoin each other in a horizontal direction in a common processing container.

The seventeenth feature of the invention resides in that the heating plate and the cooling plate are arranged so as to adjoin each other in a vertical direction in a common processing container.

According to the eighteenth feature of the present invention, there is also provided a heat treating method comprising the steps of: mounting a substrate, which has been loaded from an outside of a heat treating apparatus, on a cooling plate therein; switching from a first process of calculating and outputting a first signal corresponding to an amount of power supply for heating unit for heating a heating plate on power supply, the first process being based on a difference between a detected temperature of the heating plate and a target temperature, to a second process of outputting a second signal corresponding to an amount of power supply for the heating unit based on a predetermined output pattern, in a period from a mounting of the substrate on the cooling plate till a mounting of the substrate on the heating plate; and restarting the first process at a predetermined timing since the substrate has been mounted on the heating plate.

The nineteenth feature of the invention resides in that the second process is performed in a period from the mounting of the substrate on the cooling plate till a delivery of the substrate to a supporting member above the heating plate.

The twentieth feature of the invention resides in that the heating plate is provided with a lid body for covering an upside space of the heating plate, the second process being performed in a period from an opening of the lid body till a delivery of the substrate to a supporting member for receiving the substrate above the heating plate.

The twenty-first feature of the invention resides in that the second process is attained by outputting a signal corresponding to an amount of power supply to the heating unit so that a temperature of the peripheral area of the heating plate becomes lower than a temperature of the center are of the heating plate.

The twenty-second feature of the invention resides in that there is also provided a heat treating method comprising the steps of: mounting a substrate, which has been loaded from an outside of a heat treating apparatus, on transfer unit therein switching from a first process of calculating and outputting a first signal corresponding to an amount of power supply for heating unit for heating a heating plate on power supply, the first process being based on a difference between a detected temperature of the heating plate and a target temperature, to a second process of outputting a second signal corresponding to an amount of power supply for the heating unit based on a predetermined output pattern, in a period from a mounting of the substrate on the transfer unit till a mounting of the substrate on the heating plate; and restarting the first process at a predetermined timing after the substrate has been mounted on the heating plate.

The twenty-third feature of the invention resides in that the second process is performed in a period from the mounting of the substrate on the transfer unit till a delivery of the substrate to a supporting member above the heating plate.

The twenty-fourth feature of the invention resides in that the heating plate is provided with a lid body for covering an upside space of the heating plate, the second process being performed in a period from an opening of the lid body till a delivery of the substrate to a supporting member for receiving the substrate above the heating plate.

The twenty-fifth feature of the invention resides in that the second process is attained by outputting a signal corresponding to an amount of power supply to the heating unit so that a temperature of the peripheral area of the heating plate becomes lower than a temperature of the center are of the heating plate.

When transferring a substrate from the upside of the cooling plate onto the heating plate on which a designated heat treatment is applied on the substrate, according to the invention, it is carried out to switch the power-supply control on the heating unit from a first control to a second control in a period from the mounting of the substrate on the cooling plate until the mounting of the substrate on the heating plate. Note, in the first control, the regulating part calculates and outputs a first signal corresponding to an amount of power supply for the heating unit, based on a difference between a detected temperature of the heating plate and a target temperature. While, in the second control, the fixed-pattern output part outputs a second signal corresponding to an amount of power supply for the heating unit based on a predetermined output pattern. Subsequently, it is executed to switch the power-supply control on the heating unit from the second control to the first control at a predetermined timing since the substrate has been mounted on the heating plate.

Due to disturbance in loading a substrate (e.g. heat radiation of the heating plate when opening the lid body covering the heating plate or when opening the loading/unloading port for atmosphere including the heating plate), the temperature of the heating plate may be reduced before mounting the substrate on the heating plate. In such a case, if maintaining the regulating part's operation to enhance the temperature of the heating plate until the substrate is mounted on the heating plate, such an operation may cause the temperature of the heating plate to be enhanced excessively. According to the invention, in order to compensate the disadvantage by the operation of the regulating part, the control output for the heating unit is switched from an output of the regulating part to an output of the fixed-pattern output part at an appropriate time within a period from the mounting of the substrate on the cooling plate till the mounting of the substrate on the heating plate. Consequently, the so-elevated temperature of the heating plate due to the control through the regulating part is compensated to approach the original temperature in accordance with a predetermined fixed output pattern. Thereafter, the control through the fixed-pattern output part is changed to the control through the regulating part.

In this way, it is possible to restore the reduced temperature of the heating plate before mounting the substrate thereon to the original temperature quickly, whereby a heat treatment can be accomplished with high accuracy and short time. Additionally, by allocating output patterns to a plurality of heating unit respectively, it is possible to attain independent heat-up control with respect to each area of the heating plate in charge of each heating unit. Thus, since a deviation in temperatures of the whole surface of the substrate is restrained, it is possible to provide a heating operation with high "in-plane" uniformity. As a result, since such a heating operation allows the heating plate to be elevated in temperature while maintaining the high "in-plane" uniformity, it becomes possible to perform a heat treatment with high "in-plane" uniformity.

These and other objects and features of the present invention will become more fully apparent from the following description and appended claims taken in conjunction with the accompany drawings.

DESCRIPTION OF THE PREFERRED EMBODIMENT

Figure 1:
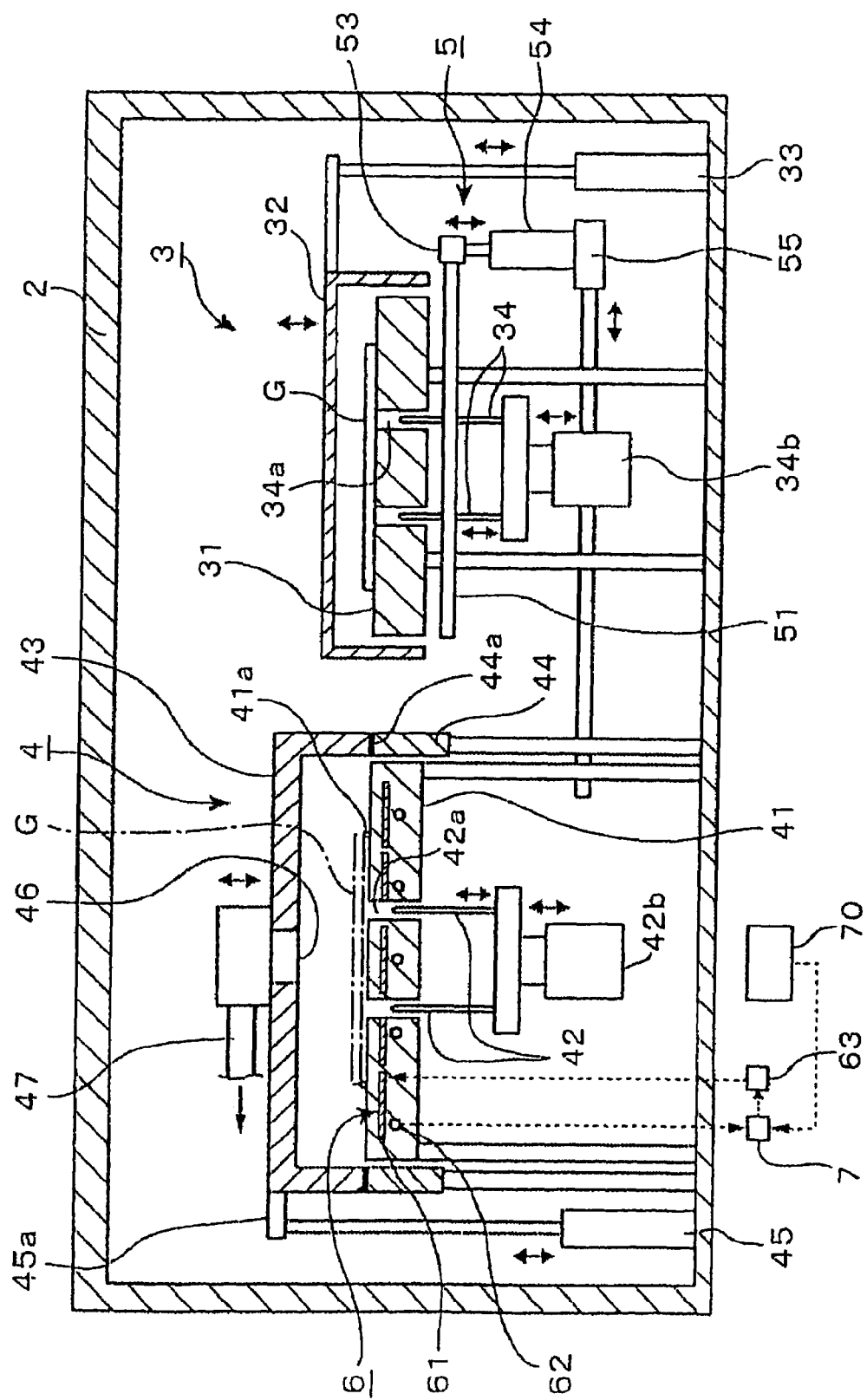
FIG. 1 is a longitudinal sectional view of an outline of a heat treating apparatus in accordance with an embodiment of the present invention.

A heat treating unit forming a heat treating apparatus of an embodiment of the present invention will be described with reference to FIGS. 1 and 2. In the figures, reference numeral 2 designates a processing container forming an exterior body of the heat treating unit, in which a cooling section 3, a heating section 4 and exclusive transfer unit (i.e. transfer mechanism) 5 are arranged. The cooling section 3 is provided to apply a designated cooling process to a substrate G, such as mask substrate, while the heating section 4 is provided to apply a designated heating process to the substrate G. The transfer unit 5 is adapted so as to transfer the substrate G between the cooling section 3 and the heating section 4 exclusively.

The cooling section 3 includes a cooling plate 31 for mounting the substrate G in a predetermined mounting area and further cooling the substrate G. In the shown example, the cooling plate 31 is formed larger than the substrate G. By a not-shown cooling unit, the temperature of the surface of the cooling plate 31 is adjusted to a designated temperature, for example, 23° C. equal to a temperature in a clean room. The cooling section 3 further includes a cover body 32 for covering a surface of the cooling plate 31 having the substrate G mounted thereon and a side face of the plate 31, together with the substrate G. Due to an elevating mechanism 33 (e.g. an air cylinder), the cooling plate 31 can move up and down between a delivering position to transfer the substrate G to and from the cooling plate 31 where the lowermost surface of the side wall of the cover body 32 is above the plate 31 and a processing position to cover the cooling plate 31.

Further, the cooling plate 31 is provided with a plurality of through-holes 34a (e.g. four holes) extending up and down. Inserted into the through-holes 34a are substrate supporting pins 34 that support the side faces of the substrate G from its back side. Each of the supporting pins 34 is formed so as to support an inclined surface at the bottom edge of the substrate G. By an elevating mechanism 34b below the cooling plate 31, respective tips of the supporting pins 34 can project from the surface of the plate 31 and also cave in the plate 31.

Figure 2:
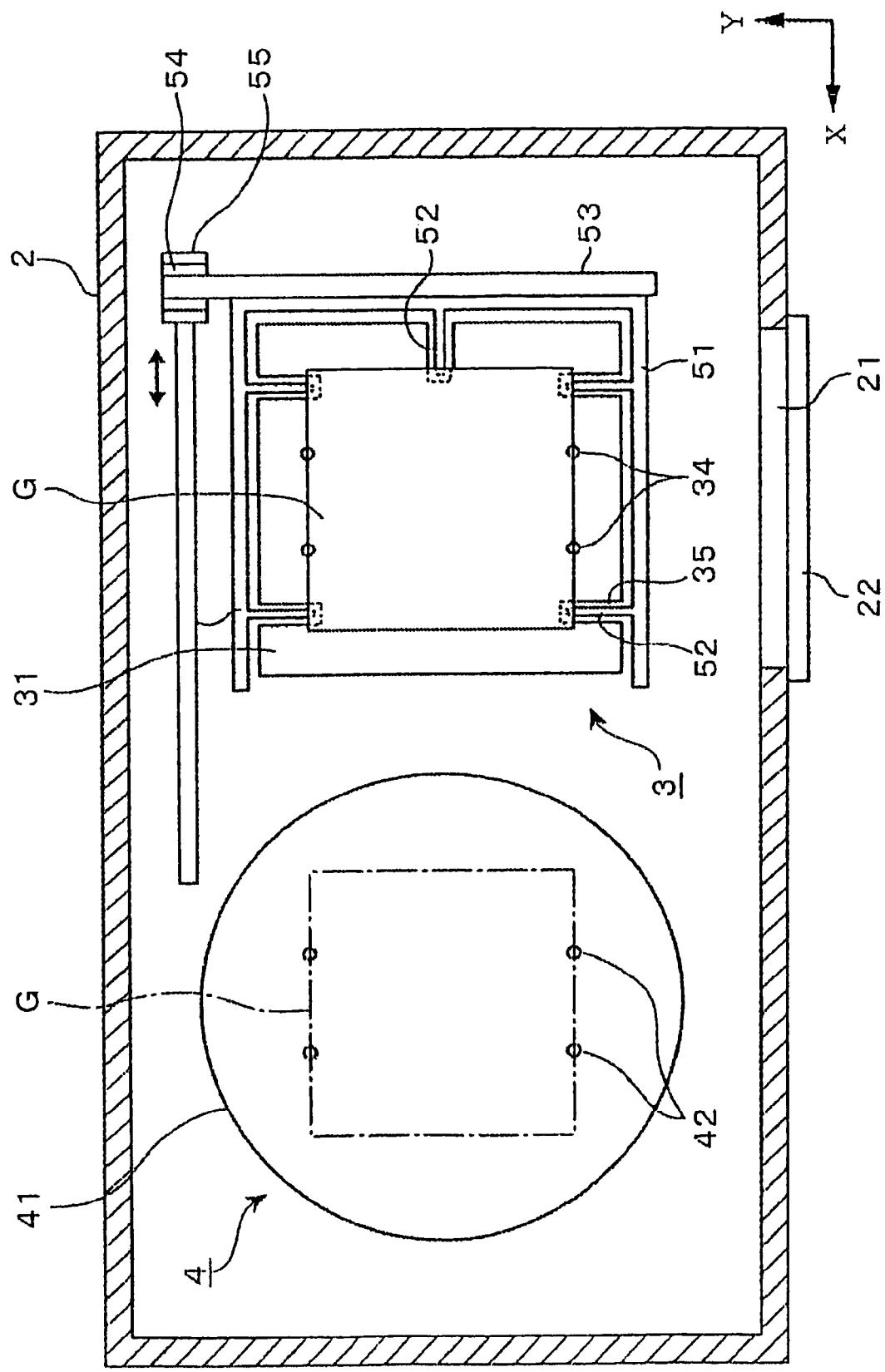
FIG. 2 is a plan view showing an outline of the heat treating apparatus of FIG. 1.

In order to allow not-shown substrate transfer unit to transfer the substrate G between the cooling plate 31 and the outside of the unit, as shown in FIG. 2, the processing container 2 is provided, at a position enabling the substrate transfer unit to have access to the cooling plate 31, with a loading/unloading port 21 that can be closed by a gate shutter 22. Collaborating with substrate transfer unit, the substrate supporting pins 34 can mount the substrate G in horizontal posture, which has been loaded into the processing container 2 via the loading/unloading port 21 by the substrate transfer unit, on the surface of the cooling plate 31.

The heating section 4 has a heating plate 41 for mounting the substrate G to be heated on a designated mounting area of the plate 41 and for heating the substrate G. In the shown example, the heating plate 41 is made of ceramics and disk-shaped larger than the substrate G. More in detail, a plurality of projections 41a are formed on the surface of the heating plate 41. Due to the projections 41a, the substrate G can be supported on the plate 41 through a slight space (e.g. an interval of 0.1 mm). In this example, the surface of the heating plate 41 is in level with the surface of the cooling plate 31.

Further, the heating plate 41 is provided with a plurality of through-holes 42a (e.g. four holes) extending up and down. Inserted into the through-holes 42a are substrate supporting pins 42 that support the side faces of the substrate G from its back side, that is, inclined surfaces of the substrate G at the bottom edge. By an elevating mechanism 42b below the heating plate 41, respective tips of the supporting pins 42 can project from the surface of the plate 41 and also cave in the plate 41. Collaborating with the transfer unit 5 mentioned later, the substrate supporting pins 42 can mount the substrate G in horizontal posture, which has been held by the transfer unit 5, on the surface of the heating plate 41. In this example, the substrate supporting pins 42 movable up and down by the elevating mechanism 42b correspond to supporting members of the invention.

A lid body 43 is arranged so as to cover the upside of the heating plate 41. Around the heating plate 41, a ring-shaped sidewall 44 is arranged so as to surround the side face of the heating plate 41. For example, the sidewall 44 is positioned so that its upper surface is in level with the top surface of the heating plate 41. A seal member 44a is fixed on the upper surface of the sidewall 44. When the lid body 43 comes into contact with the seal member 44a of the sidewall 44a through a lower face of a sidewall part of the lid body 43, a space upside the heating plate 41 is generally closed to define a processing space surrounding the circumference of the substrate G on the plate 41.

The lid body 43 is coupled to an elevating mechanism 45 (e.g. air cylinder) through a bearing part 45a. Due to the elevating mechanism 43, the lid body 43 can move up and down between a delivering position to transfer the substrate G to and from the heating plate 41 where the lowermost surface of the sidewall part of the lid body 43 is above the plate 41 and a processing position below the delivering position where the lid body 43 covers the upside of the heating plate 41. The lid body 43 is provided, at a center thereof, with an exhaust port 46 to which one end of an exhaust path 47 is connected. The other end of the exhaust path 47 is connected to not-shown exhausting unit.

As mentioned before, the transfer unit 5 fulfills a role to transport the substrate G between the cooling section 3 and the heating section 4 exclusively. In the shown apparatus, the substrate G is delivered from the outside to the cooling section 3 and subsequently, transported from the cooling section 3 to the heating section 4. Therefore, on definition of a direction from the cooling section 3 to the heating section 4 as the traveling direction of the transfer unit 5, its structure will be described.

The transfer unit 5 includes a U-shaped arm member 51 arranged so as to surround three sides of the cooling plate 31 except one side confronting the heating section 4. In the arm member 51, a plurality of holding parts 52 (e.g. five parts) are formed to extend inwardly in order to hold the substrate G. These holding parts 52 are adapted so as to support respective inclines surfaces of the three sides of the substrate G at the bottom edge. While, the cooling plate 31 is provided, at its respective portions corresponding to the holding parts 52, with recesses 35. Note, in order to avoid an interference of the transfer unit 5 with the substrate supporting pins 34, 42 in transferring the substrate G therebetween, the substrate's portions held by the holding parts 52 are different from substrate's portions held by the substrate supporting pins 34, 42. In the shown example, the holding parts 52 hold respective substrate's areas in the vicinity of respective corners of the substrate G, while the substrate supporting pins 34, 42 hold inside areas of the above areas held by the holding parts 52 respectively.

The arm member 51 is supported, at its base side (i.e. rear side in the above traveling direction), by a support body 53 in the form of a rod. One end of the support body 53 (e.g. side far from the loading/unloading port 21) is coupled to an elevating mechanism 54 (e.g. air cylinder). Consequently, the arm member 51 can move up and down between a transporting position to transfer the substrate G, which is above the cooling plate 31 and the heating plate 41 and below the cover body 32 and the lid body 43 (both at the delivering position), and a stand-by position below both surfaces of the cooling plate 31 and the heating plate 41 where the arm member 51 stands ready to the next transportation after delivering the substrate G to the heating plate 41 or the cooling plate 31. The elevating mechanism 54 is also connected to a horizontal driving mechanism 55 (i.e. rodless cylinder), allowing the arm member 51 to move between the cooling section 3 and the heating section 4 in a direction X of FIG. 2.

Figure 3:
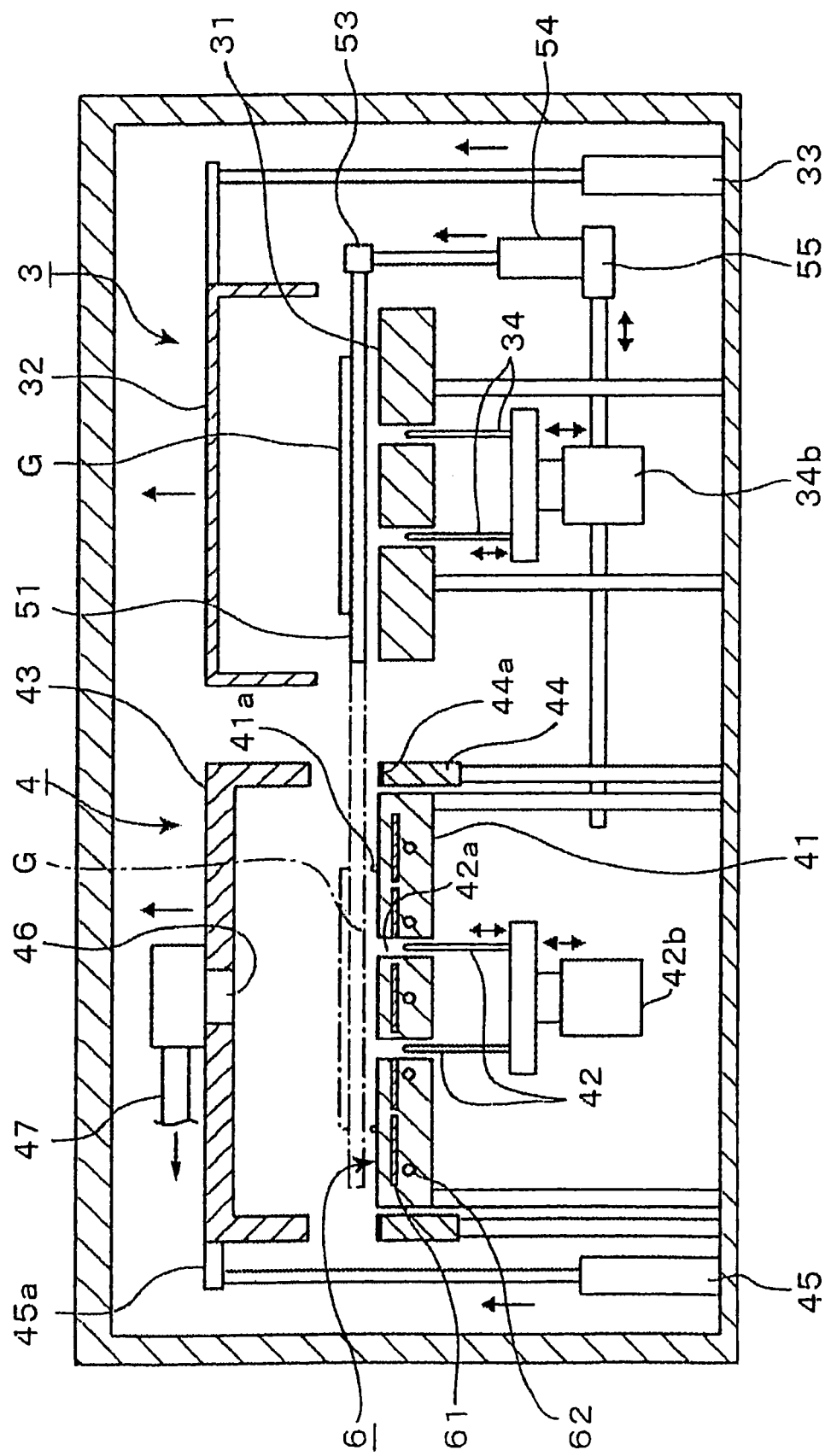
FIG. 3 is an longitudinal sectional view of the heat treating apparatus of FIG. 1, showing lid bodies being raised in the apparatus.
Figure 4:
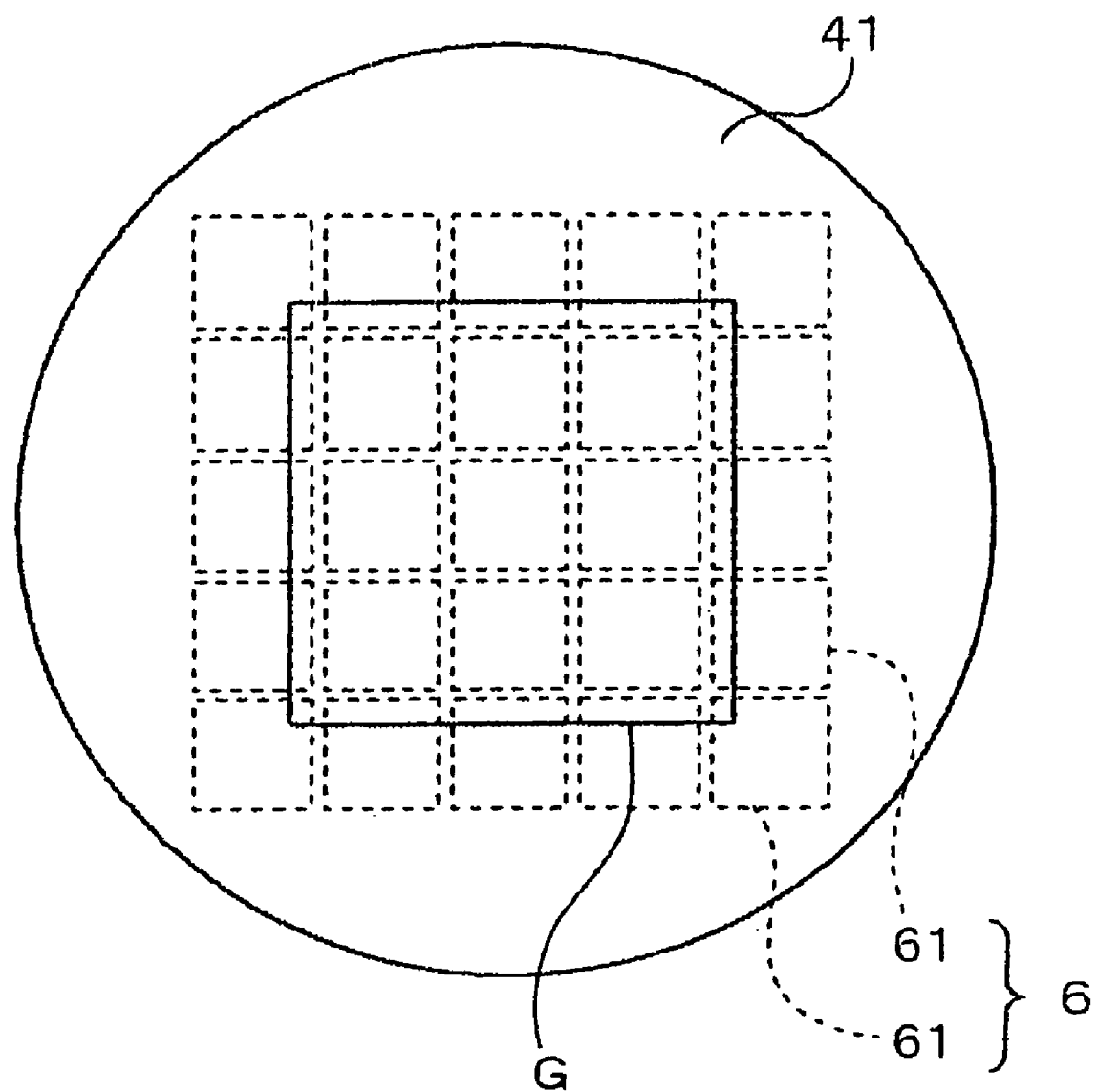
FIG. 4 is a plan view showing a heating plate and a heater in the heat treating apparatus.

In order to transfer the substrate G from the cooling section 3 to the heating section 4, as shown in FIG. 3, it is first carried out in the cooling section 3 to raise the cover body 32 up to the delivering position where the substrate G is delivered to the arm member 51 due to the collaboration with the substrate supporting pins 34 at the above transporting position above the cooling plate 31. After elevating the lid body 43 of the heating section 4 up to the delivering position, it is carried out to transport the substrate G, which is positioned above the cooling plate 31 and below the cover body 32 at the delivering position, toward the heating section 4. In the heating section 4, the substrate G is delivered from the transfer unit 5 to the substrate supporting pins 42, above the heating plate 41. Then, upon a withdrawal of the arm member 51 toward the cooling plate 31, the substrate supporting pins 42 are lowered to deliver the substrate G onto the heating plate 41. Then, the arm member 51 is positioned at the stand-by position below the cooling plate 31.

In succession, a heat supply system of the heating plate 41 will be described. Inside the heating plate 41, a heater 6 generating heat on power supply is arranged to heat the substrate G. For example, the heater 6 may be made from resistance heating elements. For instance, as shown in FIG.

4, the heater 6 is formed by rectangular heater modules 61 arranged in a mesh manner lengthwise and crosswise by five pieces each. As a result, the substrate G is heated by heat conduction from the surface of the heating plate 41 through a slight clearance, in detail, direct heat conduction through the projections 41a and heat radiation from the plate 41. Each heater module 61 is equipped with a temperature sensing part 62, such as thermocouple, for detecting a temperature of a temperature-control area in charge of the corresponding heater module 61.

For convenience' sake of illustration, FIG. 1 shows a system related to one heater module 61 representatively. However, each of the heater modules 61 is connected to a power supply unit 63. The power supply unit 63 is also connected to the temperature controller 7. In operation, based on a signal corresponding to an amount of power, which is generated from the temperature controller 7 to the heater module 61, a timing of activating a switching element in the power supply unit 63 is adjusted to control the power supply to the heater module 61, adjusting its heat value.

A control circuit in the temperature controller 7 will be described with reference to FIG. 5. For instance, the temperature controller 7 includes an accumulating part 71 for detecting a difference between a preset temperature and an actual temperature detected by the temperature sensing part 62, a PID calculating part 72 (i.e. a regulating part of the invention) that outputs a first signal corresponding to an amount of power supply to the heater module 61 to automatically control (e.g. PID control) the heating operation (or output) of the heater module 61 on a basis of the above difference calculated, and a fixed-pattern output part 73 that outputs a second signal corresponding to an amount of power supply to the heater module 61 in accordance with a preset (fixed) output pattern, performing a MV control. The preset output pattern is stored in a memory 74 (storage part) and read out by an output part 77.

Figure 5:
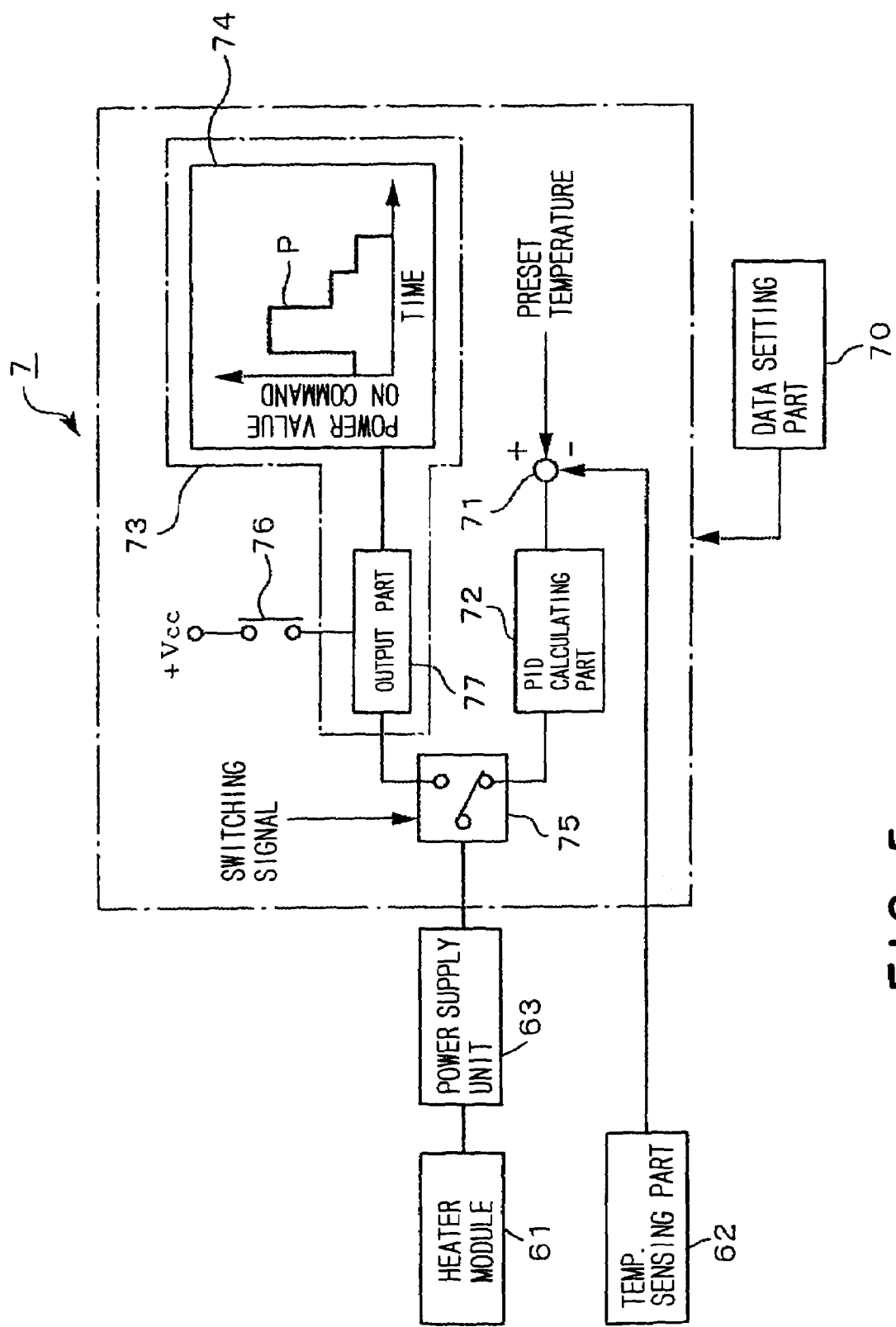
FIG. 5 is an explanatory view showing a controller for heating unit of the heat treating apparatus.

In FIG. 5, reference numeral 75 denotes a switching unit. Upon selection of either the PID calculating part 72 or the fixed-pattern output part 73 by switching the state of the switching unit 75, the substrate G is subjected to a designated heat treatment. A contact 76 is activated on detection of a situation that the lid body 43 of the heating plate 41 is raised to the delivering position through an action of the elevating mechanism 45. Preferably, what output pattern P is to be adopted and additionally, how output and time are to be established in detail may be determined by conducting experimental tests in advance.

A timing of outputting the output pattern, that is, timing of switching a control mode from the PID control by the PID calculating part 72 to the MV control by the fixed-pattern output part 73 is established at an appropriate time till the substrate G which has been mounted on the cooling plate 31 is mounted on the heating plate 41, more in detail, a predetermined time in between a time of opening the lid body 43 of the heating plate 41 (i.e. the lid body's reaching the delivering position) and a time of delivering the substrate G from the transfer unit 5 to the substrate supporting pins 42 of the heating plate 41.

Next, the heating process of the substrate G using the above-mentioned heat treating unit will be described. First of all, upon connecting the switching unit 75 to the side of the PID calculating part 72 for the PID control, it is carried out to heat the heating plate 41 by means of the heater modules 61 so that a temperature of the plate 41 becomes a preset value (e.g. 130° C.), in other words, the heating plate 41 is maintained at the preset temperature. Then, the output of each heater module 61 is controlled under the PID control so that a temperature detected by the temperature sensing part 62 coincides with the preset temperature. It is noted that, at this point of time, the cover body 32 of the cooling plate 31 and the lid body 43 of the heating plate 41 are positioned in their processing positions to cover the plates 31, 41, respectively.

Next, the gate shutter 22 is opened, and the cover body 32 of the cooling plate 31 is elevated while raising the substrate supporting pins 34 of the cooling plate 31. After that, the substrate transfer unit (not shown) enters the processing container 2 through the loading/unloading port 21 to load a substrate G having resist liquid coated in the preliminary step into the processing container 2. After delivering the substrate G to the substrate supporting pins 34, the substrate transfer unit leaves the container 2 through the loading/unloading port 21. Thereafter, the gate shutter 22 is closed and the substrate supporting pins 34 are lowered to deliver the substrate G onto the cooling plate 31. Then, the cover body 32 is also lowered to the processing position where a cooling operation for the substrate G is performed for a predetermined period (e.g. approx. 100 sec.). Since the substrate G is mounted on the cooling plate 31 whose temperature is set to a predetermined value (e.g. 23° C.) for the predetermined period, the temperature of the substrate G is in-plane uniformed over the whole surface into the stabilized condition.

In succession, the cover body 32 is raised to the delivering position, while the lid body 43 of the heating plate 41 is also raised to the delivering position. Additionally, the substrate supporting pins 34 are elevated with the rising of the transfer unit 5 and the substrate G is delivered to the transfer unit 5 through the substrate supporting pins 34. The transfer unit 5 transfers the substrate G to the upside of the heating plate 41.

Next, the substrate supporting pins 42 of the heating plate 41 is elevated to receive the substrate G from the transfer unit 5. Then, the transfer unit 5 goes backward to the side of the cooling plate 31 and falls down to the stand-by position. In the cooling section 4, the cover body 32 is lowered to the processing position to cover the cooling plate 31. While, in the heating section 4, the substrate supporting pins 42 are lowered to deliver the substrate G to the heating plate 41. The lid body 43 is also lowered to the processing position, performing a designated heat treatment for a predetermined period (e.g. approx. 600 sec.).

In the heating section 4, after the heat treatment, the lid body 43 is elevated up to the delivering position and the substrate supporting pins 42 are also elevated. In the cooling section 3, meanwhile, the cover body 32 is elevated up to the delivering position. Then, the transfer unit 5 is elevated up to the transporting position and continuously moved to the side of the heating plate 41 where the substrate G is delivered to the transfer unit 5 through the substrate supporting pins 42. Next, the transfer unit 5 goes backward to the side of the cooling plate 31 where the substrate G is delivered to the cooling plate 31 through the substrate supporting pins 34. After the delivery, the transfer unit 5 is lowered to the stand-by position and additionally, the lid body 43 and the cover body 32 are together lowered to the processing positions to surround the heating plate 41 and the cooling plate 31. In this state, a designated cooling operation is performed for a predetermined period (e.g. approx. 600 sec.). After the cooling operation, the cover body 32 is elevated up to the delivering position, and the gate shutter 22 is opened to deliver the processed substrate G to the substrate transfer unit through the substrate supporting pins 34.

As for the temperature control of the heating plate 41 in the above-mentioned operation, when the lid body 43 of the heating plate 41 is opened (i.e. reaching the delivering position) and the elevating mechanism 45 stops at a designated position, the contact 76 is turned ON. When a predetermined period has passed since the contact 76 was turned ON, the position in the switching unit 75 is switched to the side of the fixed-pattern output part 73. Simultaneously, the output part 77 reads out the output pattern stored in the memory 74 and further outputs it to the power supply unit 63.

After outputting a signal corresponding to the amount of power supply to each heater module 61, which corresponds to the preset output pattern in the memory 74, the position of the switching unit 75 is changed from one side of MV control to the other side of PID control. As a result, respective outputs of the heater modules 61 are adjusted under the PID control so that a detected temperature by the temperature sensing part 62 becomes a preset temperature. In this way, the temperature of the substrate G is stabilized at a target temperature, so that the substrate G is subjected to a baking process for a predetermined period.

The change in temperature of the heating plate 41 during the above-mentioned heating operation will be described with reference to FIG. 6. First, it is noted that the heating plate is maintained at a predetermined temperature (e.g. 130° C.) under the PID control before loading the substrate G into the container 2. Then, respective temperatures of the cooling plate 31 and the substrate G are equal to a temperature (e.g. 23° C.) of the clean room having the heat treating unit therein. After mounting the substrate G on the cooling plate 31 to start the designated cooling operation at time t1, the cover body 32 of the cooling plate 31 and the lid body 43 of the heating plate 41 are together opened (elevated) at time t2. Thereafter, at time t3, the PID control is changed to the MV control.

Here, time t3 corresponds to a time before mounting the substrate G, which has been mounted on the cooling plate 31, on the heating plate 41. That is, time t3 corresponds to a time previous to a point of time of mounting the substrate G on the heating plate 41 by a preset period, and a time before transferring the substrate G from the transfer unit 5 to the substrate supporting pins 42. It is noted that if making the substrate G stand ready above the heating plate 41 on condition that the substrate G is supported on the substrate supporting pins 42, the in-plane heat distribution of the substrate G gets worse under the influence of heat from the heating plate 41. In order to avoid such a problem, accordingly, it is carried out to lower the substrate supporting pins 42 and further deliver the substrate G to the heating plate 41 as soon as the transfer unit 5 delivers the substrate 5 to the substrate supporting pins 42. Thus, since the timing of mounting the substrate G on the heating plate 41 is about the same as the timing of delivering the substrate G to the substrate supporting pins 42, the time of "before mounting the substrate G on the heating plate 41" of the invention indicates about the same time as the time of "before delivering the substrate G to the substrate supporting pins 42".

In detail, if the temperature of heating plate 41 is in a range from 90 to 140° C. for example, the timing of switching the control mode from the PID control to the MV control is a moment of a predetermined period (e.g. 10 to 15 sec.) before a point of time of mounting the substrate G on the heating plate 41 as a result of lowering the substrate supporting pins 42.

When the predetermined period has passed from time t3, it is carried out to mount the substrate G on the heating plate 41 at time t4. Here, the mounting of the substrate G indicates a point of time of delivering the substrate G onto the heating plate 41 as a result of lowering the substrate supporting pins 42 of the plate 41. After mounting the substrate G on the heating plate 41 at time t4, the control mode is changed from the MV control to the PID control at a predetermined timing of time t5. Here, time t5 corresponds to a point of time of completing to output the fixed pattern of the MV control started at time t3.

Note, the predetermined timing of switching from the MV control to the PID control sequential to mounting the substrate G on the heating plate 41 is a time when the temperature of the heating plate 41 is in the course of approaching a target temperature after once falling due to the mounting of the substrate G, for example, a time when the temperature of the plate 41 has approached a temperature within the range of ±4% to the target temperature. In detail, if the temperature of the heating plate 41 is in the range from 90 to 140° C., the timing of switching from the MV control to the PID control is a time when a predetermined period, for example, a time when an interval from 100 to 200 sec. has passed since the substrate G was mounted on the plate 41.

According to the MV control, at a point of time of switching the control mode from the PID control at time t3, it is first executed to make the outputs of the heater modules 61 for heating the peripheral area of the heating plate 41 smaller than the outputs of the heater modules 61 for heating the center area of the plate 41. At time t4 when the substrate G is mounted on the heating plate 41, the overall output of the heater modules 61 is further reduced while maintaining to make the outputs of the heater modules 61 for the peripheral area of the heating plate 41 smaller than the outputs of the heater modules 61 for the center area of the plate 41. In succession, while keeping this relationship in output, the whole output of the modules 61 is gradually increased.

In this case, for instance, to make the outputs of the heater modules 61 for heating the center area of the plate 41 larger than the outputs of the heater modules 61 for heating the peripheral area of the plate 41 is accomplished by either making an amount of power supply for the former heater modules 61 larger than that for the latter heater modules 61 or supplying an electric power to the former heater module 61 prior to the latter heater modules 61 due to division of the heater 6 into the heater modules 61 thereby allowing the former heater modules 61 to output prior to the output of the latter heater modules 61.

When the predetermined period measured by e.g. a timer has passed since the substrate G was mounted on the heating plate 41 detected, the PID control is restored by the switching unit 75 turning to the side of the PID calculating part 72. Thus, the output of the power supply unit 63, i.e. a heating value of each heater module 61 is controlled so that a temperature detected by the temperature sensing part 62 becomes the preset value, whereby the temperature of the substrate G can be maintained at the target temperature stably. As a result, as shown with solid line of FIG. 6, the temperature of the heating plate 41 becomes substantially constant from time t3 to time t4. Between time t4 and time t5, the temperature of the heating plate 41 once drops and subsequently, it rises gradually. After time t5, the temperature of the plate 41 is maintained at the target value under the PID control.

That is, since it is under the PID control at a point of time of opening the lid body 43 above the heating plate 41, when the lid body 43 is opened so that the temperature of the heating plate 41 falls due to heat radiation, in detail, if the temperature of the peripheral area of the plate 41 becomes lower than that of the center area, the PID control usually intends to restore a so-reduced temperature of the peripheral area based on the temperature reduction. Therefore, according to the invention, it is carried out to switch the control mode from the PID control to the MV control early before mounting the substrate G on the heating plate 41, intending to make the temperature of the peripheral area, which has been elevated as a result of opening the lid body 43 due to the PID control, close to the target temperature with aid of the MV control.

Thus, after switching from the PID control to the MV control at time t3, it is carried out to control the amount of power supply under the MV control that lowers the output of the peripheral area of the plate 41 while enhancing the output of the center area so that the temperatures of the heater modules 61 in the center area becomes higher than those of the heater modules 61 in the peripheral area. That is, the peripheral area of higher temperature due to the PID control is heated at a lower temperature under the MV control, while the center area of lower temperature is heated at a higher temperature. Accordingly, it is possible to uniform the in-plane heat distribution of the heating plate 41.

When the substrate G is mounted on the heating plate 41 at time t4, it is carried out to reduce the whole output while maintaining the state where the output of the center area is larger than the output of the peripheral area. At the moment of mounting the substrate G on the heating plate 41, the temperature of the substrate G abruptly falls since the heat of the plate 41 is absorbed in the substrate G. However, if rapidly increasing the outputs of the heater modules 61 at this stage, the temperature change of the plate 41 would overgrow. Therefore, in order to suppress the overgrowth in the temperature change, it is carried out to reduce the outputs of the heater modules 61 at time t4 and subsequently increase the outputs gradually. In this way, it is possible to raise the temperature of the heating plate 41 moderately, restricting a malign influence upon the characteristics of film thickness.

Figure 6:
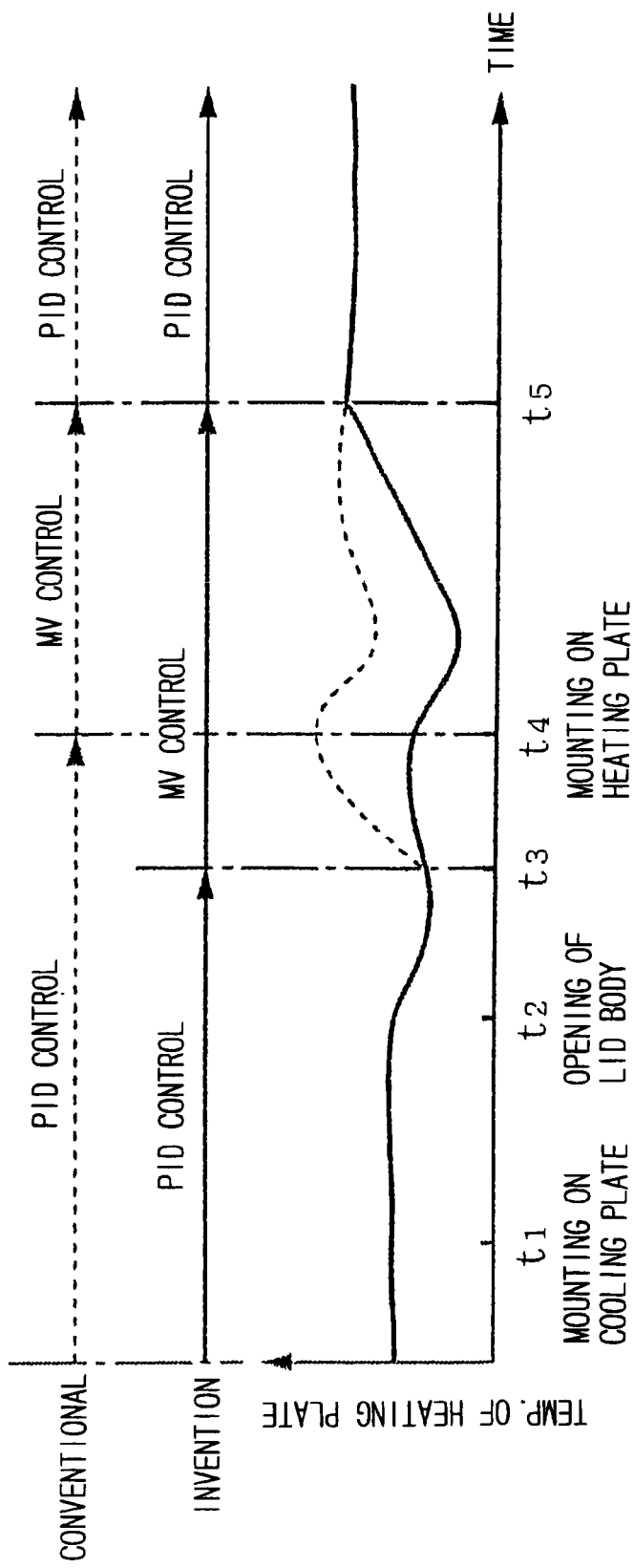
FIG. 6 is a diagram showing the temperature change of a substrate heated by the heat treating apparatus.

Here, we discuss the conventional control method shown with broken lines of FIG. 6. In accordance with the conventional method, since the control mode is changed from the PID control to the MV control at time t4, that is, when mounting the substrate G on the heating plate 41, the temperature abruptly rises during a period from time t3 to time t4. The reason of this sharp rise in temperature is because if the opening of the lid body 43 of the heating plate 41 causes the temperature of the peripheral area of the plate 41 to be lowered in comparison with the temperature of the center area, the PID control would operate to abruptly restore a so-reduced temperature of the peripheral area based on the temperature reduction. Thereafter, at time t4, the MV control allows the temperature of the plate 41 to abruptly fall in order to restore the sharp rise in temperature during the period from time t3 to time t4 and continuously, the temperature of the plate 41 will be maintained at the target value by the PID control started at time t5 again. However, it is noted that the sharp rise in temperature during the period from time t3 to time t4 has a damaging effect on the temperature distribution in the substrate, so that the in-plane uniformity in film thickness would deteriorate.

FIG. 6 illustrates the temperature pattern of the heating plate 41 schematically. Meanwhile, we actually measured respective temperatures of the vicinities of the peripheral area and the center area by use of a thermometric substrate equipped with a plurality of sensors. In this empirical testing, the heating plate 41 was heated up to 140° C. and the PID control was changed to the MV control on establishment of time t3 that coincides with a point of 10 to 20 sec. before against the mounting of the substrate G on the plate 41 (t4). The result is that the temperature (transient) distribution during the heat-up period was approx. 1° C. On the other hand, another heating process was also carried out by switching the control mode from the PID control to the MV control at time t4 (i.e. a point of time of mounting the substrate on the heating plate). The result is that the temperature (transient) distribution during the heat-up period was approx. 2° C. In conclusion, it is found that the switching of the control mode from the PID control to the MV control prior to the point of time when the substrate G is mounted on the heating plate 41 allows the uniformity in in-plane temperature to be improved during the heat-up period.

In this way, according to the present invention, since the switching point of time from the PID control to the MV control is advanced ahead of the point of time of mounting the substrate G on the heating plate 41 by a period necessary for reducing an elevated temperature of the peripheral area of the plate 41 in comparison with the preset temperature as a result of the PID control's action intending to compensate the operation of the control part due to disturbance in loading the substrate G, in other words, the PID control's action based on a reduction in temperature of the peripheral area of the plate 41 due to opening of the lid body 43, it is possible to restore the reduction in temperature of the plate 41 caused by opening the lid body 43 to the original temperature, as possible. Consequently, the heat treatment on the substrate can be accomplished in a short time, with high accuracy. Simultaneously, since an abrupt temperature rise having a damaging effect on the formation of uniform film thickness, which might be caused in the prior art method at a point of switching to the MV control, is suppressed, it is possible to enhance the in-plane uniformity in temperature of the heating plate 41.

Assuming that the temperature of the peripheral area of the heating plate 41 is reduced approx. 2° C. by opening the lid body 43 of the plate 41, the PID control based on this reduction allows the above temperature to be elevated 3° C. until the substrate G is mounted on the plate 41 and that the reconversion of so-elevated temperature to the original temperature takes up e.g. a period of 10±2 sec., the timing of switching to the MV control is a time preceding a point of time of mounting the substrate G on the plate 41 by an interval equal to the above period. In practice, by trial and error while processing a test substrate by use of the above-mentioned apparatus, there are determined these values, that is, a reduction in temperature of the peripheral area of the plate 41 when opening the lid body 43, a rise in temperature of the plate 41 by the PID control based on the reduction, what time the MV control should be started in advance of mounting of the substrate G on the heating plate 41 in order to heat up it with high in-plane uniformity, and how much of outputs and how long the power should be supplied to the heater modules 61. The timing of starting the MV control and the output patterns both obtained in the above way are stored in the memory 74.

In this regard, when respective output patterns drafted for the heater modules 61 are employed, it becomes possible to attain the heat-up control for matching respective areas in charge of the respective heater modules 61. Thus, with restriction of a deviation in temperatures in the surface of the substrate G, it is possible to accomplish the uniform heating operation, that is, the formation of a coating film having a uniform film thickness on the whole surface of the substrate G in this example. Again, since the heat treating unit is constructed so as to control the outputs for the respective heater modules 61 in accordance with the output patterns, it is possible to adjust the heat-up pattern of the heating plate by modifying respective shapes of the output patterns.

In the invention, the cooling section 3 and the heating section 4 are together arranged in the common processing container 2, while the exclusive transfer unit 5 transfers the substrate G between the cooling section 3 and the heating section 4. Therefore, the carrying time for the transfer unit 5 to transport the substrate G from the cooling section 3 to the heating section 4 becomes constant irrespective of the busy condition of the substrate transfer unit (not shown), it is possible to align the starting time of the MV control, suppressing a deterioration of the temperature distribution in the substrate G due to deviations in the carrying time.

In connection, since the heat treating unit is also constructed so as to transfer the substrate G between the exterior substrate transfer unit and the cooling section 3, the mounting of the substrate G on the cooling section 3 previous to the heat treatment allows respective temperatures in the substrate G to be uniformed and stabilized all over substrate's surface. On the other hand, since the heating section 4 becomes possible to control the temperature of the heating plate 41 during the mounting of the substrate G on the cooling section 3 or the transfer unit 5, namely, in advance of the mounting of the substrate G on the heating plate 41, the in-plane uniformity in temperature distribution of the heating plate 41 at heating can be improved.

Now, we discuss a structure where the above cooling plate 31 is not provided in the processing container. Also in this case, it is possible to suppress an abrupt rising in temperatures of the peripheral area of the heating plate 41 by switching the control mode from the PID control to the MV control while allowing the substrate transfer unit to retain the substrate G after opening the lid body 43. However, this operation would cause the transporting efficiency of the substrate transfer unit to deteriorate remarkably. Alternatively, it may be estimated that the heat treating unit is operated so as to switch from the PID control to the MV control on condition of carrying the substrate G above the plate 41 through the substrate supporting pins 42. In this case, however, as heat transfer occurs from the plate 41 to the substrate G via the pins 42, the substrate G would be heated inhomogeneously. As a mask substrate is thickened to have a great heat capacity generally, if there is once established a temperature distribution where a temperature of the peripheral area of the substrate are higher than that of the center area, then it is difficult to restore such a temperature distribution to the uniform temperature distribution. For these reasons, it will be understood that the heat treating unit and method in accordance of the present invention have a great effect on the above characteristic features.

In another structure where the heating section 4 and the cooling section 3 are arranged independently of each other and the substrate transfer unit transfers from the cooling section 3 to the heating section 4, a transportation time of the substrate G from the cooling is easy to vary depending on the busy condition of the substrate transfer unit. As a result, the heat distribution deteriorates.

There is also known a heat treating unit where a cooling plate and a heating plate are together arranged in a common processing container and the cooling plate itself transfers a substrate G. In such a heat treating unit having the cooling plate serving as the transfer unit, when transferring the substrate G from the cooling plate to the heating plate, the cooling plate passes through the upside of the heating plate and then, part of heat transfers from the heating plate to the cooling plate. Therefore, the temperature of the cooling plate is easy to change, causing the temperature accuracy of the cooling plate to be lowered. While, as mentioned above, a mask substrate is generally thickened to have a great heat capacity, requiring high temperature accuracy. Therefore, the heat treating unit of this kind is not suitable for heat treatment of mask substrates. From this point of view, the heat treating unit of the invention is also advantageous to the heat treatment of mask substrates since the cooling plate 31 and the transfer unit 5 are arranged independently of each other and additionally, the cooling plate 31 is maintained at a constant temperature.

As mentioned above, according to the present invention, the PID control is changed to the MV control at an optional point between a time of mounting the substrate G on the cooling plate 31 and another time of mounting the substrate G on the heating plate 41, thereby starting the MV control. In a modification, the memory 74 may store data where a variety of parameters in the heat treatment of the substrate G correspond to various timings of switching the control output between the PID control and the MV control, respectively. In operation of this modification, it is executed to read out a switching timing between the PID control and the MV control from the above memory 74, corresponding to the sort of heat treatment designated by selecting unit (e.g. host computer), so that the switching between the PID control and the MV control is performed in accordance with the switching timing read out of the memory 74. Here, as for the parameters of heat treatment, there can be enumerated processing temperature (i.e. target temperature), kinds of substrates, kinds of resists, film thickness, kinds of heating plates, etc. In this way, by switching the control mode from the PID control to the MV control at an appropriate timing corresponding to the contents of the heat treatment, it is possible to accomplish a heating process exhibiting high "in-plane" uniformity with respect to the formation of film thickness.

Here, in this example, both establishment and rewriting of the output patterns and the timings of switching between the PID control and the MV control is carried out by using a data setting part 70 in a controlling section for controlling the whole operations of the heat treating unit apparatus, as shown in FIGS. 1 and 5. The data setting part 70 may be formed by a host computer connected to respective temperature controllers 7 (only one shown in the figure). If a handy-type computer, such as notebook type computer, is employed as the data setting part 7, then an operator's setting work can be performed at a working site with ease.

Figure 7:
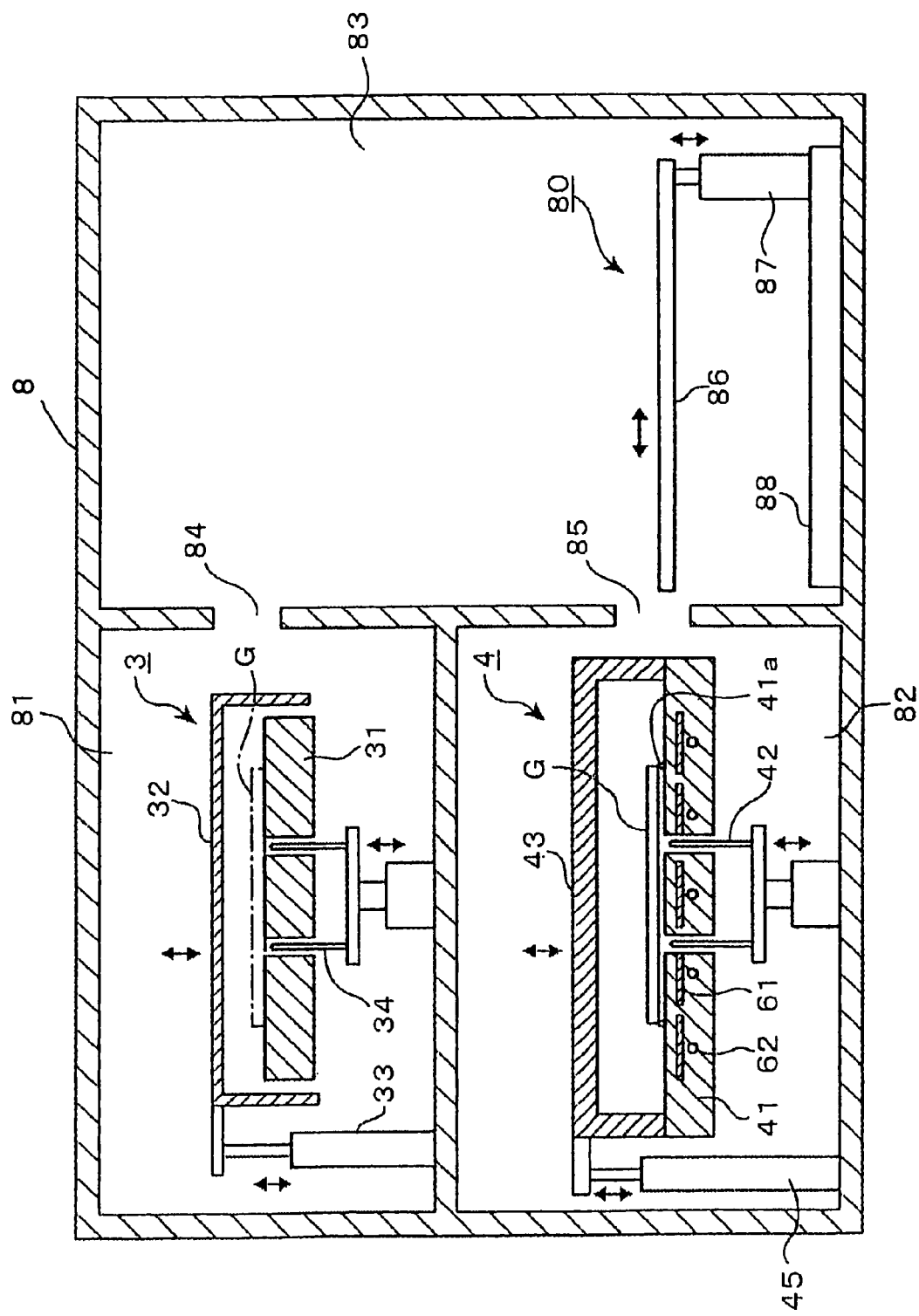
FIG. 7 is a longitudinal sectional view of an outline of a heat treating apparatus in accordance with another embodiment of the present invention.

Next, another example of the heat treating unit of the present invention will be described with reference to FIG. 7. According to this embodiment, the cooling section 3 and the heating section 4 are arranged up and down in the common processing container 8. The interior of the processing container 8 is divided into a plurality of areas (e.g. three areas). The cooling section 3 is arranged in a first processing area 81, while the heating section 4 is arranged in a second processing area 82 below the first processing area 81. An area adjacent to the first and second processing areas 81, 82 is defined as a transfer area 81 provided with transfer unit 80.

A wall part forming a boundary between the first processing area 81 and the transfer area 83 and another boundary between the second processing area 82 and the transfer area 83 is provided with loading/unloading ports 84, 85. The transfer unit 80 is adapted so as to transport the substrate G into the respective processing areas 81, 82 through the ports 84, 85, respectively. The cooling section 3 and the heating section 4 are constructed similarly to those of the previously-mentioned embodiment. In the transfer unit 80, an arm member 86 constructed similarly to the arm member 51 of the above transfer unit 5 is movable up and down by an elevating mechanism 7. Additionally, the same member 86 can move along a guide rail 88 to enter the processing areas 81, 82. That is, the member 86 can reciprocate between a delivering position to deliver the substrate G to the cooling plate 31 and a "stand-by" position in the transfer area 83 and between another delivering position to deliver the substrate G to the heating plate 41 and another "stand-by" position in the transfer area 83.

In this heat treating unit, a substrate G is transferred from the outside of the processing container 8 to the transfer unit 80 through a not-shown loading/unloading port formed in the transfer area 83 and continuously delivered, via the transfer unit 80, to the cooling plate 31 of the first processing area 81 where a designated cooling operation is performed. Next, by the transfer unit 80, the substrate G is transferred from the first processing area 81 to the second processing area 82 through the transfer area 83 and further delivered to the heating plate 41 in the area 82 where a designated heat treatment is performed. Next, by the transfer unit 80, the substrate G is again transferred from the second processing area 82 to the first processing area 81 through the transfer area 83 and further delivered to the cooling plate 31 in the area 81 where the designated cooling operation is performed. Thereafter, the substrate G is discharged from the unit by the transfer unit 80. Alternatively, the substrate G after the designated heat treatment on the heating plate 41 may be discharged from the unit directly after the transfer unit 80 has transferred the substrate G from the second processing area 82 into the transfer area 83. As the disturbance in loading the substrate (i.e. opening of the lid body 43) causes the temperatures of the peripheral area of the heating plate 41 to be lowered in this heat treating unit as well, the PID control is changed to the MV control in process of transferring the substrate G from the cooling plate 31 to the heating plate 41 (i.e. when a predetermined period has passed since the lid body 43 was opened) and successively, the MV control is changed to the PID control after mounting the substrate G on the heating plate 41 (i.e. after another predetermined period has passed since the changing point to the MV control). Consequently, it is possible to heat the heating plate 41 while maintaining high "in-plane" uniformity in temperatures of the plate 41, performing a heat treatment of high in-plane uniformity.

Note, in this example, since the cooling section 3 and the heating section 4 are respectively arranged in the different processing areas 81, 82 in thermal separation, there is less possibility that the cooling plate 31 is influenced by heat of the heating plate 41. Therefore, the cover body 32 above the plate 31 may be eliminated from the cooling section 3 in one modification.

Figure 8:
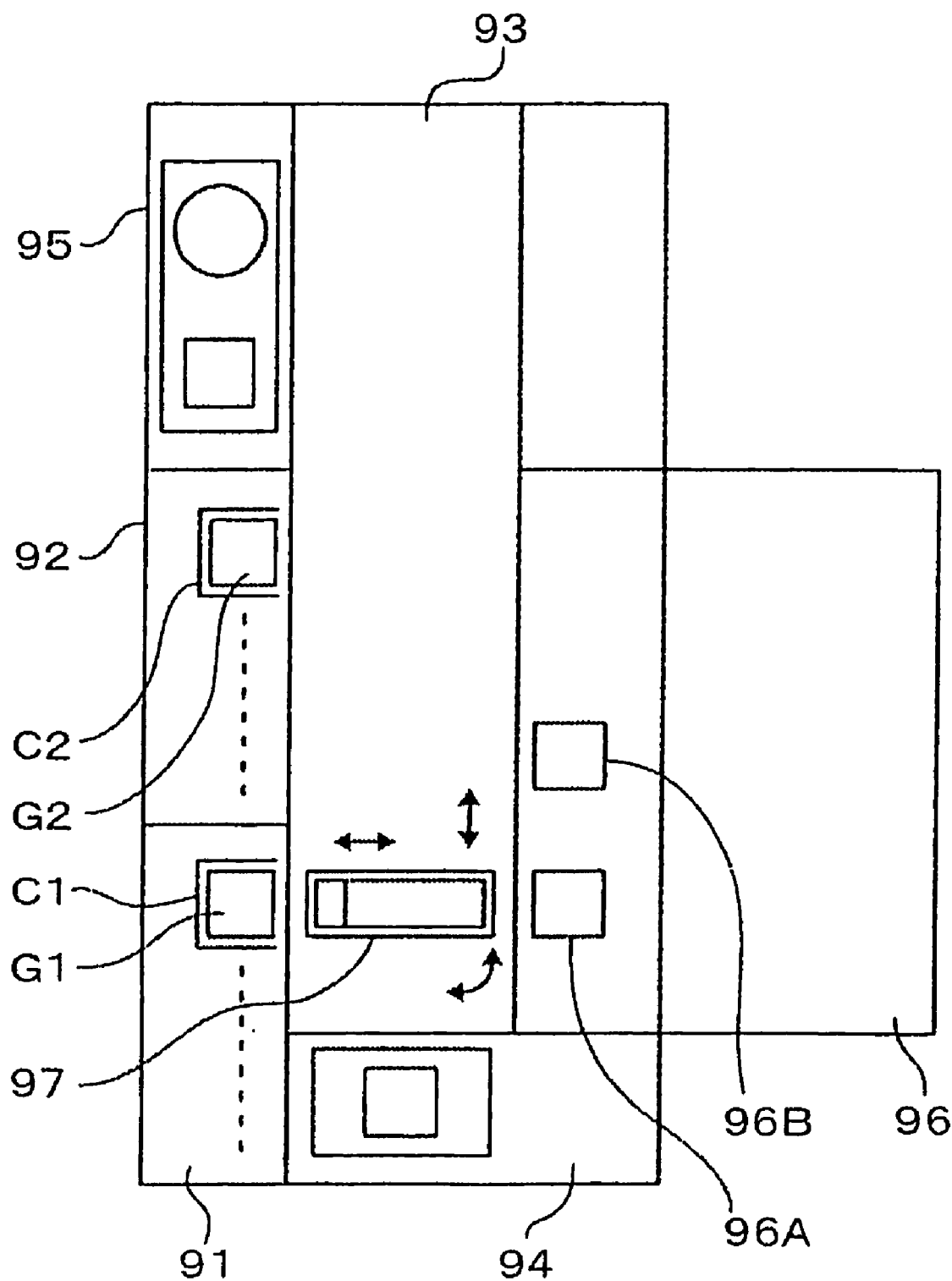
FIG. 8 is a plan view of a substrate processing system having a built-in heat treating apparatus.

Finally, one example of a substrate processing system where the heat heating unit of the present invention is built in will be described with reference to FIG. 8. It is noted in the example that the heat treating unit is employed as a unit for heating a substrate after exposure and before development. In the figure, reference numeral 91 denotes a loading carrier stage that loads a carrier C1 in which a plurality of unprocessed substrates G1 are accommodated, into the heat treating unit. Adjacently to the stage 91, an unloading carrier stage 92 is arranged to unload a carrier C2 accommodating a plurality of processed substrates G2 from the unit.

The loading carrier stage 91 and the unloading carrier stage 92 are connected to a transfer area 93 for the substrates. Additionally, there are a cooling unit 94 for cooling the substrates, a heat treating unit 95 of the invention, a loading stage 96A of an exposure unit 96 and its unloading stage 96B, all of which are connected to the transfer area 93. Substrate transfer unit 97 is provided in the transfer area 93. The substrate transfer unit 97 is formed so as to be movable up and down, rotatable about a vertical axis and reciprocable. With the possibility of such functions, the substrate transfer unit 97 can approach any one of the loading carrier stage 91, the unloading carrier stage 92, the cooling unit 94, the heat treating unit 95, the loading stage 96A and the unloading stage 96B of the exposure unit 96. In the example, the heat treating unit of FIGS. 1 and 7 may be built in the system, corresponding to the heat treating unit 95. Then, the processing container 2 (8) for the heat treating unit 95 is formed by respective walls of the substrate processing system.

The flow of the substrates G in this system will be described below. First, the carrier C1 accommodating the substrates G1 having resist liquid applied thereon in the previous process is laid down on the loading carrier stage 91. Then, the substrate transfer unit 97 transfers each of the substrates G1 from the stage 91 to the cooling unit 94 and the loading stage 96A of the exposure unit 96, in that order. At the exposure unit 96, each of the substrates G1 is subjected to a designated exposure process. By the substrate transfer unit 97, the substrate G after the exposure process is transferred to the heat treating unit 95 through the unloading stage 96B of the exposure unit 96. In the heat treating unit 95, a heat treatment after exposure and before development and a cooling process sequential to the heat treatment are applied on the substrate G. After that, the substrate G is transferred to an exposure unit in the next process via the unloading carrier stage 92 by the substrate transfer unit 97.

It is noted that the above-mentioned substrate processing system specializes in the cooling process before exposure and the heat treatment after exposure and before development against the substrates each having the resist liquid applied thereon. In case of mask substrates each having "chemical-amplification" type resist applied thereon, there is no problem of wasting a time in transporting the substrate G to the exposure process so long as a multiplication of acid in the chemical-amplification type resist comes to a standstill owing to the heat treatment and the sequent cooling process at the heat treating unit 95.

Here noted, as a mask substrate is relatively large, the above-mentioned system that exclusively applies the cooling process before exposure and the heat treatment and the sequent cooling process after the exposure and before development on the substrates G having the resist liquid applied thereon, is effective in view of reducing the size of the apparatus and its occupation area, in comparison with an apparatus where a number of processing units for the application process of resist, the development process, the cooling and heating processes before and after development, etc. are built in. This substrate processing system may have a plurality of heat treating units 95 piled in a multistage manner.

In case of multiple heat treating units in the substrate processing system, it is possible to allocate a common fixed output pattern to the respective units, saving a labor for initialization. Additionally, even if there are differences among the units (e.g. their structures of different assemblies, conditions of air current above the substrate G), a fine adjustment of the output pattern with respect to each unit could suppress a deviation of treatments among the units.

As for the disturbance in loading a substrate, according to the invention, there are included one reduction in temperatures of the peripheral area of the heating plate due to opening of the lid body of the heating plate and the other reduction in temperatures of the peripheral area of the heating plate due to opening of the loading/unloading port of the processing container provided with the heating plate. Additionally, the present invention is also applicable to such an apparatus exhibiting a reduction in temperature of the whole heating plate due to such a disturbance in loading the substrate in spite of no separation in the heater 6. That is, in such a case, the temperature of the heating plate is reduced since heat radiation arises from the heating plate before mounting a substrate on the plate. In order to restore the reduction in the temperature, when the above regulating part continues to carry out a control of increasing the temperature of the heating plate until the substrate is mounted on the heating plate, the temperature of the heating plate is elevated too excessively. Therefore, it is executed to switch the control mode from the control by the regulating part to the control by the fixed-pattern output part in a period of transporting the substrate from the cooling plate to the heating plate, allowing the temperature of the heating plate elevated due to the control by the regulating part to approach the original temperature in accordance with a preset fixed output pattern. Thereafter, it is executed to switch the control mode from the control by the fixed-pattern output part to the control by the regulating part. With this control for switching, it is possible to restore the temperature of the heating plate in a short time and also possible to stabilize the temperature of the plate rapidly, offering advantages of performing the heating process with high accuracy in a short time.

Figure 9:
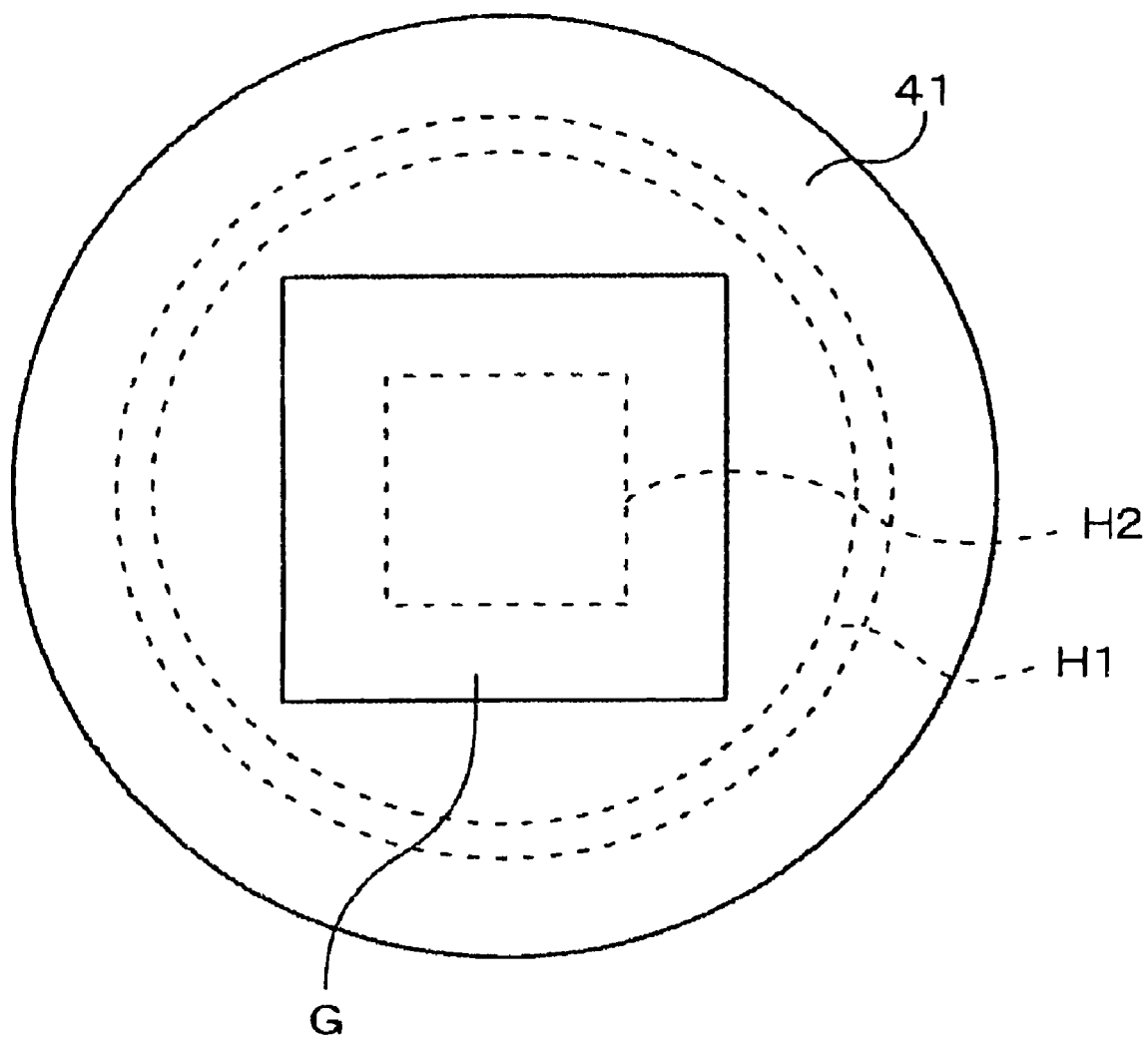
FIG. 9 is a plan view showing another example of the heater in the heat treating apparatus.
Figure 10:
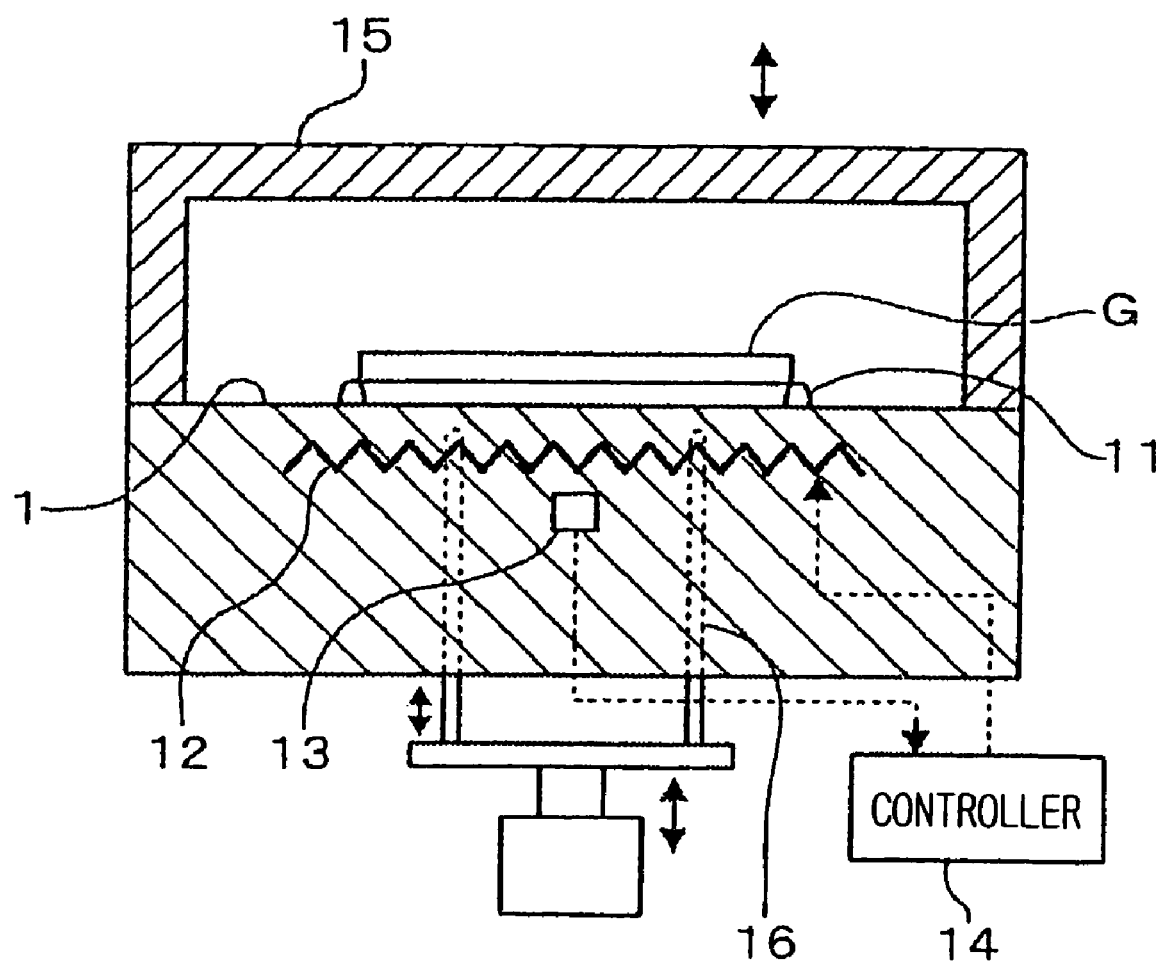
FIG. 10 is an explanatory view showing a background art heating device.

Besides the illustrated structure of FIG. 3 where the heater 6 is divided into a number of heater modules, as shown in FIG. 9, the present invention is also applicable to a structure where the heater 6 is divided into one heater module H1 for heating the peripheral area of the heating plate 41 and another heater module H2 for heating the center area of the plate 41. Additionally, in the MV control, the operations of the heater modules 61 may be controlled in accordance with either different output patterns or a common output pattern.

Additionally, the present invention is also applicable to an heat treating apparatus for: directly delivering a substrate from the outside (e.g. substrate after exposure) to transfer unit above the cooling plate; transferring the substrate onto the heating plate by the transfer unit; applying a designated heating process on the substrate through the heating plate; transferring the substrate from the heating plate the cooling plate by the transfer unit; applying a designated cooling process on the substrate through the cooling plate; and for transferring the substrate from the cooling plate to exterior substrate transfer unit directly or indirectly through the above transfer unit. In this apparatus, it is executed to switch the control mode from the PIC control to the MV control before the substrate is mounted on the heating plate by the transfer unit receiving the substrate from the exterior substrate transfer unit. Also in this case, the switching from the PID control to the MV control is performed until the substrate is transferred from the transfer unit to the substrate supporting pins of the heating plate, more in detail, in a period form the opening of the lid body of the heating plate to the mounting of the substrate on the substrate supporting pins.

Then, since the PID control is switched to the MV control while a transfer arm holding the substrate is standing ready for a predetermined period, the temperature of the substrate approaches an interior temperature of the apparatus during its ready and waiting. That is, as the above-mentioned abrupt reduction in temperature of the heating plate at the time of mounting the substrate on the plate is restrained, it is possible to make the temperature of the heating plate approach a target processing temperature in a short time stably, accomplishing a heat treatment with high accuracy in a short time.

In connection, the invention is also applicable to a modified apparatus having no cooling plate, which is adapted so that transfer unit receives a substrate from the outside of the apparatus, the transfer unit transports the substrate to a heating plate on which a designated heat treatment is performed, the transfer unit receives the substrate after the heat treatment and that the transfer unit delivers the processed substrate to exterior substrate transfer unit. Alternatively, the apparatus may be modified so that the transfer unit further serves as a cooling plate.

According to the present invention, the heat treatment applied to a substrate G is not limited to a process of heating a substrate G having an embrocation coated thereon only. Therefore, the invention is also applicable to a heating process after applying the above-mentioned resist liquid on the substrate G or a heating process after the exposure of chemical-amplifying type resist and before developing the resist. Alternatively, for instance, the heat treatment may be identical to a heating process (baking) of an interlayer insulation film or an insulation film forming a protective film of the device. Furthermore, according to the present invention, a substrate G to be processed is not limited to a mask substrate only. Thus, the invention is also applicable to a heat treatment for semiconductor wafers, LCD substrate, etc.

The invention claimed is:

1. A heat treating apparatus comprising:
   a heating plate for applying a designate heat treatment to a substrate mounted on a surface of the heating plate, the heating plate being heated by heating unit generating heat on power supply;
   a cooling plate on which the substrate loaded from its outside is mounted, thereby cooling down the substrate;
   transfer unit configured to exclusively transfer the substrate between the cooling plate and the heating plate;
   a temperature sensing part for detecting a temperature of the heating plate; and
   a regulating part for calculating an amount of power supply for the heating unit based on a difference between the temperature detected by the temperature sensing part and a target temperature, the regulating part further outputting a first signal corresponding to the amount of power supply calculated;
   a fixed-pattern output part for outputting a second signal corresponding to an amount of power supply for the heating unit based on a predetermined output pattern; and
   switching unit that switches a control output from an output of the regulating part to an output of the fixed-pattern output part in a period from a mounting of the substrate on the cooling plate till a mounting of the substrate on the heating plate and that switches the control output from the output of the fixed-pattern output part to the output of the regulating part at a predetermined timing after the substrate has been mounted on the heating plate, so as to compensate the operation of the regulating part derived from any disturbance in loading the substrate.

2. The heat treating apparatus as claimed in claim 1, further comprising a supporting member that is movable up and down, for receiving the substrate above the heating plate when rising and also mounting the substrate onto the heating plate when falling, wherein the switching unit switches the control output from the output of the regulating part to the output of the fixed-pattern output part in a period from the mounting of the substrate on the cooling plate till a delivery of the substrate to the supporting member.

3. The heat treating apparatus as claimed in claim 2, further comprising a lid body for covering an upside space of the heating plate, wherein the switching unit switches the control output from the output of the regulating part to the output of the fixed-pattern output part in a period from an opening of the lid body till a mounting of the substrate on the supporting member.

4. The heat treating apparatus as claimed in claim 1, wherein the heating unit is divided into a first heater part for heating the peripheral area of the heating plate and a second heater part for heating the center area of the heating plate, and the temperature sensing part, the fixed-pattern output part and the regulating part are respectively provided in respective groups, corresponding to the first heater part and the second heater part of the heating unit.

5. The heat treating apparatus as claimed in claim 1, further comprising:

a memory for memorizing a data where sorts of processes to be applied on the substrate respectively correspond to timings of switching the control output between the output of the regulating part and the output of the fixed-pattern output part and selecting unit for selecting a timing of switching the control output between the output of the regulating part and the output of the fixed-pattern output part from the memory, corresponding to the sort of a process applied on the substrate.

6. The heat treating apparatus as claimed in claim 1, wherein the heating plate and the cooling plate are arranged so as to adjoin each other in a horizontal direction in a common processing container.

7. The heat treating apparatus as claimed in claim 1, wherein the heating plate and the cooling plate are arranged so as to adjoin each other in a vertical direction in a common processing container.

8. A heat treating apparatus comprising:

a heating plate for applying a designate heat treatment to a substrate mounted on a surface of the heating plate, the heating plate being heated by heating unit generating heat on power supply;

transfer unit configured to receive the substrate loaded from an outside of the apparatus and exclusively transfer the substrate to the heating plate;

a temperature sensing part for detecting a temperature of the heating plate; and a regulating part for calculating an amount of power supply for the heating unit based on a difference between the temperature of the heating plate detected by the temperature sensing part and a target temperature, the regulating part further outputting a first signal corresponding to the amount of power supply calculated;

a fixed-pattern output part for outputting a second signal corresponding to an amount of power supply for the heating unit based on a predetermined output pattern; and switching unit that switches a control output from an output of the regulating part to an output of the fixed-pattern output part in a period from a mounting of the substrate on the transfer unit till a mounting of the substrate on the heating plate through a transportation of the transfer unit and that switches the control output from the output of the fixed-pattern output part to the output of the regulating part at a predetermined timing since the substrate has been mounted on the heating plate, thereby compensating the operation of the regulating part derived from any disturbance in loading the substrate into the apparatus.

9. The heat treating apparatus as claimed in claim 8, further comprising a cooling plate for applying a designate cooling process to the substrate, wherein the transfer unit is configured to transfer the substrate between the cooling plate and the heating plate exclusively.

10. The heat treating apparatus as claimed in claim 8, wherein the transfer unit also serves as a cooling plate for applying a designate cooling process to the substrate.

11. The heat treating apparatus as claimed in claim 8, further comprising a supporting member that is movable up and down, for receiving the substrate above the heating plate when rising and also mounting the substrate onto the heating plate when falling, wherein the switching unit switches the control output from the output of the regulating part to the output of the fixed-pattern output part in a period from a mounting of the substrate on the transfer unit till a delivery of the substrate to the supporting member.

12. The heat treating apparatus as claimed in claim 11, further comprising a lid body for covering an upside space of the heating plate, wherein the switching unit switches the control output from the output of the regulating part to the output of the fixed-pattern output part in a period from an opening of the lid body till a mounting of the substrate on the supporting member.

13. The heat treating apparatus as claimed in claim 8, wherein the heating unit is divided into a first heater part for heating the peripheral area of the heating plate and a second heater part for heating the center area of the heating plate, and the temperature sensing part, the fixed-pattern output part and the regulating part are respectively provided in respective groups, corresponding to the first heater part and the second heater part of the heating unit.

14. The heat treating apparatus as claimed in claim 13, wherein the output pattern is adapted so as to allow the fixed-pattern output part to output respective signals corresponding to respective amounts of power supply to the first heater part and the second heater part of the heating unit so that a temperature of the peripheral area of the heating plate becomes lower than a temperature of the center are of the heating plate.

15. The heat treating apparatus as claimed in claim 8, further comprising:

a memory for memorizing a data where sorts of processes to be applied on the substrate respectively correspond to timings of switching the control output between the output of the regulating part and the output of the fixed-pattern output part and selecting unit for selecting a timing of switching the control output between the output of the regulating part and the output of the fixed-pattern output part from the memory, corresponding to the sort of a process applied on the substrate.

16. The heat treating apparatus as claimed in claim 8, wherein the heating plate and the cooling plate are arranged so as to adjoin each other in a horizontal direction in a common processing container.

17. The heat treating apparatus as claimed in claim 8, wherein the heating plate and the cooling plate are arranged so as to adjoin each other in a vertical direction in a common processing container.

18. A heat treating method comprising the steps of:

mounting a substrate, which has been loaded from an outside of a heat treating apparatus, on a cooling plate therein;

switching from a first process of calculating and outputting a first signal corresponding to an amount of power supply for heating unit for heating a heating plate on power supply, the first process being based on a difference between a detected temperature of the heating plate and a target temperature, to a second process of outputting a second signal corresponding to an amount of power supply for the heating unit based on a predetermined output pattern, in a period from a mounting of the substrate on the cooling plate till a mounting of the substrate on the heating plate; and restarting the first process at a predetermined timing after the substrate has been mounted on the heating plate.

19. The heat treating method as claimed in claim 18, wherein the second process is performed in a period from the mounting of the substrate on the cooling plate till a delivery of the substrate to a supporting member above the heating plate.

20. The heat treating method as claimed in claim 18, wherein the heating plate is provided with a lid body for covering an upside space of the heating plate, the second process being performed in a period from an opening of the lid body till a delivery of the substrate to a supporting member for receiving the substrate above the heating plate.

21. The heat treating method as claimed in claim 18, wherein the second process is attained by outputting a signal corresponding to an amount of power supply to the heating unit so that a temperature of the peripheral area of the heating plate becomes lower than a temperature of the center are of the heating plate.

22. A heat treating method comprising the steps of:

mounting a substrate, which has been loaded from an outside of a heat treating apparatus, on transfer unit therein;

switching from a first process of calculating and outputting a first signal corresponding to an amount of power supply for heating unit for heating a heating plate on power supply, the first process being based on a difference between a detected temperature of the heating plate and a target temperature, to a second process of outputting a second signal corresponding to an amount of power supply for the heating unit based on a predetermined output pattern, in a period from a mounting of the substrate on the transfer unit till a mounting of the substrate on the heating plate; and restarting the first process at a predetermined timing after the substrate has been mounted on the heating plate.

23. The heat treating method as claimed in claim 22, wherein the second process is performed in a period from the mounting of the substrate on the transfer unit till a delivery of the substrate to a supporting member above the heating plate.

24. The heat treating method as claimed in claim 22, wherein the heating plate is provided with a lid body for covering an upside space of the heating plate, the second process being performed in a period from an opening of the lid body till a delivery of the substrate to a supporting member for receiving the substrate above the heating plate.

25. The heat treating method as claimed in claim 22, wherein the second process is attained by outputting a signal corresponding to an amount of power supply to the heating unit so that a temperature of the peripheral area of the heating plate becomes lower than a temperature of the center are of the heating plate.

\* \* \* \* \*